US010295558B2

(12) United States Patent
Thompson et al.

(10) Patent No.: US 10,295,558 B2
(45) Date of Patent: May 21, 2019

(54) OFFSET REJECTION ELECTRODES

(71) Applicant: InvenSense, Inc., San Jose, CA (US)

(72) Inventors: Matthew Julian Thompson, Beaverton, OR (US); Antonio Molfese, Carugate (IT)

(73) Assignee: InvenSense, Inc., San Jose, CA (US)

( * ) Notice: Subject to any disclaimer, the term of this patent is extended or adjusted under 35 U.S.C. 154(b) by 0 days.

(21) Appl. No.: 15/609,757

(22) Filed: May 31, 2017

(65) Prior Publication Data

US 2017/0260039 A1 Sep. 14, 2017

Related U.S. Application Data

(63) Continuation-in-part of application No. 14/714,149, filed on May 15, 2015, now Pat. No. 9,952,252.

(51) Int. Cl.
*G01P 15/125* (2006.01)
*B81B 7/00* (2006.01)
*G01P 15/08* (2006.01)

(52) U.S. Cl.
CPC ............ *G01P 15/125* (2013.01); *B81B 7/008* (2013.01); *G01P 2015/0831* (2013.01)

(58) Field of Classification Search
CPC ........... G01P 15/125; G01P 2015/0831; B81B 7/0016; B81B 2203/0307
See application file for complete search history.

(56) References Cited

U.S. PATENT DOCUMENTS

| | | |
|---|---|---|
| 4,372,162 A | 2/1983 | Shutt |
| 4,398,417 A | 8/1983 | Shutt |
| 4,398,418 A | 8/1983 | Shutt et al. |
| 4,644,793 A | 2/1987 | Church |
| 4,951,508 A | 8/1990 | Loper, Jr. et al. |
| 5,383,362 A | 1/1995 | Putty et al. |
| 5,406,848 A | 4/1995 | Okada |
| 5,419,194 A | 5/1995 | Varnham et al. |
| 5,495,760 A | 3/1996 | Wirt |
| 5,497,668 A | 3/1996 | Okada |
| 5,712,426 A | 1/1998 | Sapuppo et al. |
| 6,196,067 B1 | 3/2001 | Martin et al. |
| 6,314,823 B1 | 11/2001 | Okada |
| 7,549,334 B2 | 6/2009 | Cardarelli |
| 8,616,056 B2 | 12/2013 | Sammoura et al. |

(Continued)

FOREIGN PATENT DOCUMENTS

| | | |
|---|---|---|
| GB | 2272054 A | 5/1994 |
| GB | 2310284 A | 8/1997 |

*Primary Examiner* — David J Bolduc

(57) ABSTRACT

A MEMS sensor includes a sensing reference plane, an anchor, a proof mass, and sensing elements. The anchor is coupled to the sensing reference plane and to the proof mass that moves under an external excitation. The sensing elements detect motion normal to the sensing reference plane. A summation of a product of polarity for each sensing element, its area, and its distance to the anchor on one side of an axis line is unequal to a summation of a product of a polarity associated with each sensing element, its associated area, and its distance to the anchor on another side of the axis line. As such, external excitation creates an offset. The offset is substantially constant for curvature angles (0°-360°) of the sensing reference plane. The offset is greater than zero and is less than a maximum offset for a MEMS sensor with perfect symmetry for its sensing elements.

21 Claims, 22 Drawing Sheets

(56) References Cited

U.S. PATENT DOCUMENTS

| | | |
|---|---|---|
| 8,631,700 B2 | 1/2014 | Sammoura et al. |
| 8,661,898 B2 | 3/2014 | Watson |
| 8,852,984 B1 | 10/2014 | Quevy et al. |
| 9,599,471 B2 | 3/2017 | Vohra et al. |
| 2004/0216523 A1 | 11/2004 | Lehtonen |
| 2009/0095081 A1 | 4/2009 | Nakatani |
| 2009/0100930 A1 | 4/2009 | Coronato et al. |
| 2009/0107239 A1 | 8/2009 | Nakatani |
| 2012/0017681 A1 | 1/2012 | Reinmuth et al. |

OFFSET REJECTION ELECTRODES

RELATED APPLICATIONS

The present application is a continuation in part, and claims the benefit and priority to the U.S. application Ser. No. 14/714,149 filed on May 15, 2015, the content of which is incorporated in its entirety by reference.

BACKGROUND

Microelectromechanical system (MEMS) sensors experience a variety of undesirable forces that can come from the fabrication of the MEMS/complementary metal-oxide-semiconductor (CMOS) die, packaging of the die, operation over temperature, shock conditions, user assembly, and many others. These forces cause non-ideal conditions such as deviations in the parallel alignment between the MEMS sensor and an embedded sensing reference plane.

SUMMARY

Therefore, there is a strong need for a solution that overcomes the aforementioned issues. The present embodiments address such a need. A system and method for reducing offset in a MEMS sensor are disclosed. In a first aspect, the system is a MEMS sensor that comprises a sensing reference plane, at least one anchor coupled to the sensing reference plane, at least one proof mass coupled to the at least one anchor, wherein one of the at least one proof mass moves under an external excitation, a pattern of sensing elements coupled between the sensing reference plane and the at least one proof mass to detect motion normal to the sensing reference plane, wherein the pattern of sensing elements shares at least three axes of polarity anti-symmetry, and a signal processing circuit to combine the pattern of sensing elements thereby providing an output proportional to the external excitation.

In a second aspect, the sensing reference plane is divided by two axes forming four quadrants on the sensing reference plane and the pattern of sensing elements comprises at least three sensing elements in each of the four quadrants.

In a third aspect, a method provides the MEMS sensors as described above in the first and the second aspects.

Provided herein is a Microelectromechanical System (MEMS) sensor comprising a sensing reference plane, an anchor, a proof mass, and a plurality of sensing elements. The anchor is coupled to the sensing reference plane. The proof mass is coupled to the anchor and the proof mass moves under an external excitation. The plurality of sensing elements is coupled between the sensing reference plane and the proof mass to detect motion normal to the sensing reference plane. For any axis line on the reference plane that passes through the anchor the offset is the summation of the product of each of the sensing elements associated polarity, area and distance to the axis line, is nonzero. For all given lines between 0°-360° the maximum offset summation is reduced. In an embodiment, for all given lines between 0°-360° the offset is substantially constant where the constant offset is greater than zero and less than the maximum offset for a MEMS sensor which periodically has offset summations of zero for lines between 0° to 360° degrees. A lower worst case maximum offset is beneficial in the sensors ability to reject all offset sources from tilt and curvature between the proof mass and the sensing reference plane.

The MEMS sensor may include a signal processing circuit configured to combine the sensing elements to provide an output that is proportional to the external excitation. The plurality of sensing elements may form a variable capacitor between each sensing element and the proof mass. The sensor element could also be, piezo-resistive, piezo-electric, magnetic, optical or other. It is appreciated that each sensing element may be a magnetic sensing element. It is appreciated that each sensing element may be any of circular, rectangular, square, hexagonal, octagonal, annular sector, and polygonal in shape.

In some embodiments, the offset summation product is further based on a gap between the proof mass and sensing elements. In another embodiment, the offset summation product is further based on a polynomial function of the distance between the electrode to the axis line. These and other features and advantages will be apparent from a reading of the following detailed description.

BRIEF DESCRIPTION OF THE DRAWINGS

The accompanying figures illustrate several embodiments and, together with the description, serve to explain the principles of the embodiments. One of ordinary skill in the art readily recognizes that the embodiments illustrated in the figures are merely exemplary, and are not intended to limit the scope of the present embodiments.

DETAILED DESCRIPTION

Figure 1:
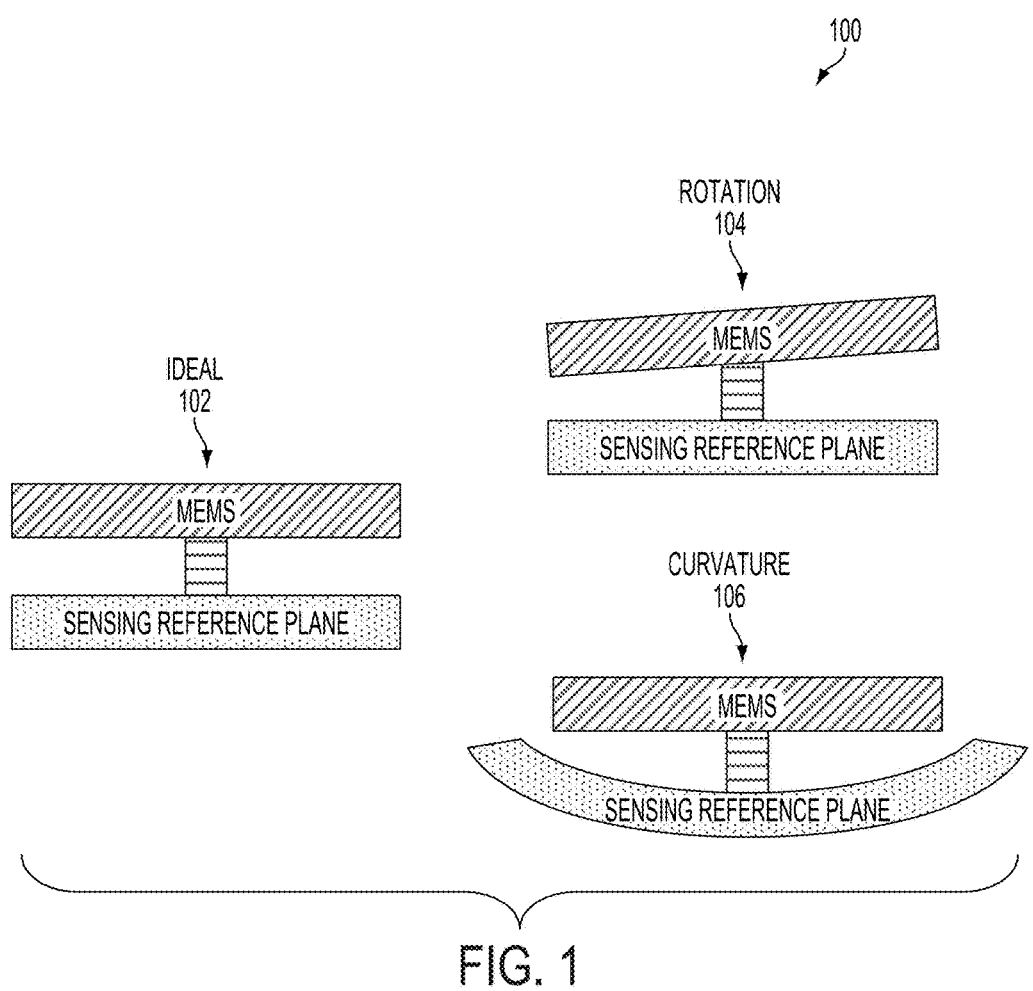
FIG. 1 illustrates a cross-sectional diagram of ideal and non-ideal MEMS sensor conditions in accordance with an embodiment.

Before various embodiments are described in greater detail, it should be understood that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood that the terminology used herein is for the purpose of describing the certain concepts, and the terminology is not intended to be limiting. Unless defined otherwise, all technical and scientific terms used herein have the same meaning as commonly understood in the art to which the embodiments pertain.

Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "beside," "forward," "reverse," "overlying," "underlying," "up," "down," or other similar terms such as "upper," "lower," "above," "below," "under," "between," "over," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Terms such as "over," "overlying," "above," "under," etc. are understood to refer to elements that may be in direct contact or may have other elements in-between. For example, two layers may be in overlying contact, wherein one layer is over another layer and the two layers physically contact. In another example, two layers may be separated by one or more layers, wherein a first layer is over a second layer and one or more intermediate layers are between the first and second layers, such that the first and second layers do not physically contact.

Micro-electro-mechanical systems (MEMS) refers to a class of microscale devices fabricated using semiconductor-like processes and exhibiting mechanical characteristics such as the ability to move or deform. MEMS often, but not always, interact with electrical signals. A MEMS device may refer to a semiconductor device implemented as a micro-electromechanical system. A MEMS device includes mechanical elements and optionally includes electronics for sensing. MEMS devices include but are not limited to microscale gyroscopes, accelerometers, magnetometers, and pressure sensors.

In one embodiment, a MEMS sensor comprises a MEMS device, a sensing reference plane, and an anchor that connects the MEMS device to the sensing reference plane. MEMS sensors can experience undesirable forces during the fabrication and operation of the MEMS sensors. These undesirable forces include but are not limited to stresses from fabrication and packaging of the MEMS/CMOS die, operation over temperature, shock conditions, and user assembly which cause non-ideal conditions such as deviations in the parallel alignment between the MEMS device and the sensing reference plane.

There are at least two independent undesirable deviations of the parallel alignment between the MEMS device and the sensing reference plane that occur. Firstly, shear forces on the anchor cause the anchor to tilt relative to the sensing reference plane. Secondly, bending forces cause the sensing reference plane to curve relative to the MEMS device. Therefore, the gap $z(x,y)$ between sensing reference plane and the MEMS device varies with the x and y position and is described from the anchor center as a linear function and a non-linear curvature component per the following equation: $z(x,y)=gap+R(x,y)+Curv(NL(x,y))$; where the gap=ideal initial parallel gap, $R(x,y)$ is the rotation and $Curv(NL(x,y))$ is a mathematical description of the curvature that can be a polynomial, trigonometric series, power series or similar non-linear function or series.

FIG. 1 illustrates a cross-sectional diagram 100 of ideal and non-ideal MEMS sensor conditions in accordance with an embodiment. In one embodiment, the MEMS sensor includes at least a MEMS device, a sensing reference plane, and an anchor that couples the MEMS device to the sensing reference plane. In the diagram 100, an ideal condition 102 shows parallel alignment between the MEMS device and the sensing reference plane. In the diagram 100, a first non-ideal condition 104 shows a deviation in the parallel alignment due to an undesired linear tilt of at least one surface (either the MEMS device as depicted and/or the sensing reference plane). In the diagram 100, a second non-ideal condition 106 shows a deviation in the parallel alignment due to an undesired curvature of at least one surface (either the sensing reference plane as depicted and/or the MEMS device).

A system and method in accordance with the present embodiment provides a MEMS sensor with a sensing reference plane that comprises a pattern of sensing elements (electrodes) to improve offset rejection. The pattern of sensing elements can be a plurality of patterns of electrodes that reduce the offset caused from the deviation of the parallel alignment between the MEMS device and the sensing reference plane. The sensing reference plane is connected to a MEMS device via an anchor. The MEMS device includes a spring connected between the anchor and a proof mass. Each electrode of the plurality of patterns of electrodes is located on the sensing reference plane such as a CMOS substrate. In a MEMS device/CMOS substrate die configuration, the proof mass and one of the plurality of electrodes located on the CMOS substrate (or sending reference plane) form a parallel plate capacitor.

To describe the features of the present embodiment in more detail, refer now to the following description in conjunction with the accompanying Figures.

Figure 2A:
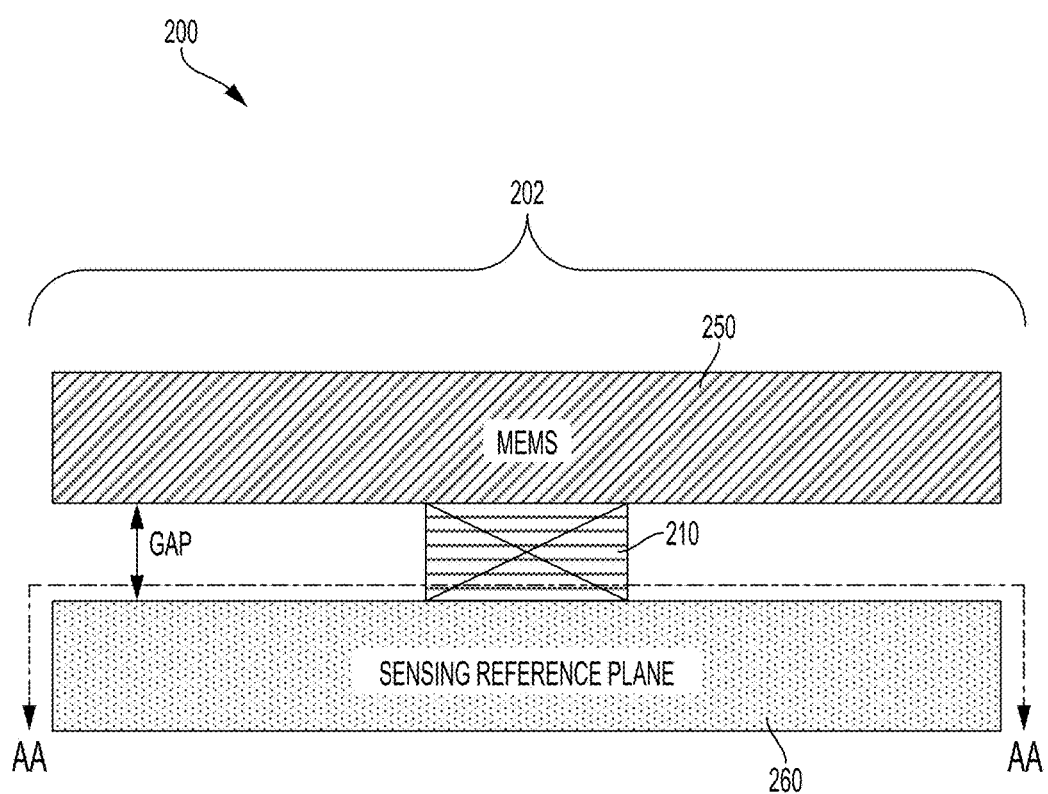
FIG. 2A illustrates a diagram with a cross-sectional view of a substrate portion of a MEMS sensor with a pattern of sensing elements in accordance with an embodiment.

FIG. 2A illustrates a diagram 200 with a cross-sectional view 202 of a substrate portion of a MEMS sensor with a pattern of sensing elements in accordance with an embodiment. The cross-sectional view 202 shows a MEMS sensor that comprises a MEMS device 250 coupled to a sensing reference plane 260 via the anchor 210 thereby creating a gap between the MEMS device 250 and the sensing reference plane 260. In the cross-sectional view 202, AA depicts the height of the sensing reference plane 260. In one embodiment, the MEMS device 250 is any of a MEMS structure and a MEMS accelerometer.

Figure 2B:
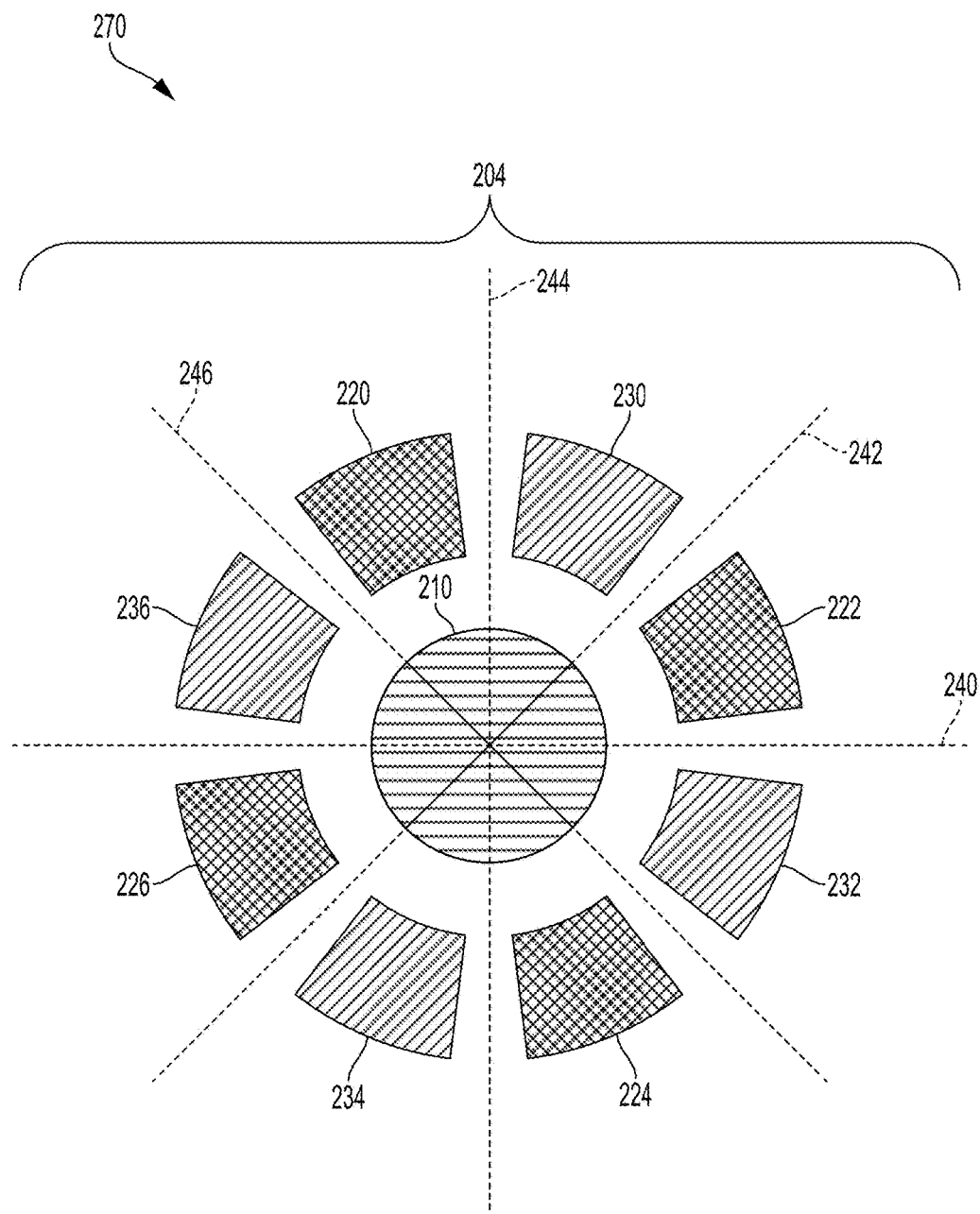
FIG. 2B illustrates a diagram with a top view of a substrate portion of a MEMS sensor with a pattern of sensing elements in accordance with an embodiment.

FIG. 2B illustrates a diagram 270 with a top view 204 of a substrate portion of a MEMS sensor with a pattern of sensing elements in accordance with an embodiment. The top view 204 shows a top view of AA which results in a top side of the pattern of sensing elements that comprise positive and negative electrodes. The top view 204 includes the anchor 210 of the MEMS sensor, positive electrodes 220, 222, 224, and 226, negative electrodes 230, 232, 234, and 236, and four axes of polarity anti-symmetry 240, 242, 244, and 246 denoted by the dashed lines. In FIG. 2A and FIG. 2B, the shape of the anchor 210 is circular to correspond to the shape of the pattern of sensing elements which is also circular.

In one embodiment, the MEMS device 250 comprises a spring connected between the anchor 210 and a proof mass. The proof mass moves in the z axis to an external force that includes but is not limited to acceleration, magnetic, Coriolis, pressure, and many others. The pattern of sensing elements comprise alternating positive and negative electrodes 220-226 and 230-236 and are connected between the MEMS device 250 and the sensing reference plane 260. The positive electrode sensing elements 220-226 detect positive movements and the negative electrode sensing elements 230-236 detect negative movements. In one embodiment, the shape of the electrode sensing elements 220-226 and 230-236 are annular sectors.

Figure 2C:
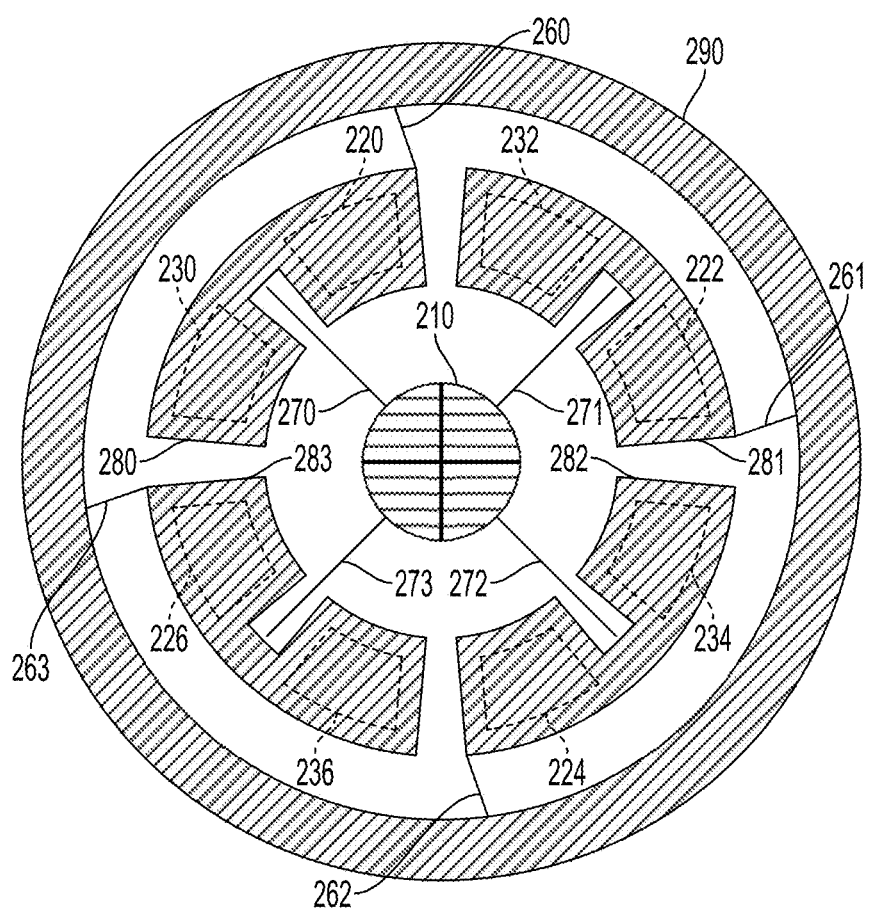
FIG. 2C illustrates a MEMS device of the MEMS sensor in accordance with an embodiment.

FIG. 2C illustrates a MEMS device of the MEMS sensor in accordance with an embodiment. In FIG. 2C, the MEMS device resembles the MEMS device 250 of FIG. 2A and is a MEMS Z axis accelerometer. In one embodiment, the MEMS device 250 further comprises, a first set of springs (260-263) and a second set of springs (270-273), sense plates 280-283, and a proof mass 290. The sense plates 280-283 are connected to the anchor 210 via the second set of springs 270-273 respectively. The sense plates 280-283 are connected to the proof mass 290 via the first set of springs 260-263 respectively. The sense masses 280-283 are detected by the positive electrodes 220, 222, 224, 226 respectively and by the negative electrodes 230, 232, 234, 236 respectively.

In one embodiment, the MEMS device 250 under positive (+) Z axis out-of-plane acceleration causes the proof mass 290 to move in a negative (−) z axis direction. The deflected proof mass 290 pushes on the first set of springs 260-263 thereby rotating the sense plates 280-283 about the second set of springs 270-273 respectively. This causes the gap between the positive electrodes 220, 222, 224 and 226 and each of the sense masses 280-283 to decrease and also causes the gap between the negative electrodes 230, 232, 234 and 236 and the sense plates 280-283 to increase.

In one embodiment, the MEMS device 250 under non-ideal conditions would behave like a flat plate like described by MEMS devices 104 and 106. The electrode pattern 204 has the properties of sensing the deflection of the MEMS device 250 under Z-axis acceleration but also rejecting non-ideal motion of MEMS device 250 described by MEMS device 104 and 106 in FIG. 1.

In this embodiment, the electrode sensing elements 220-226 and 230-236 form a differential sensing scheme. For example, the differential sensing scheme enables a gap to decrease above sensing elements 220, 222, 224, and 226 and to increase above sensing elements 230, 232, 234, and 236. Thus, motion is only detected if the gap between each pair of the positive electrode sensing elements 220-226 and the negative electrode sensing elements 230-236 and the MEMS device 250 changes due to movement by the proof mass. Therefore, the proof mass moves in a path that causes detectable motion using the differential scheme of the pattern of sensing elements (electrodes). The center of each of the sensing elements 220-226 and 230-236 has a common distance from the center of the anchor 210. As aforementioned, the sensing elements 220-226 and 230-236 have four axes of polarity anti-symmetry 240-246. In another embodiment, the pattern of sensing elements is designed with three or more axes of symmetry.

In the top view 204 of FIG. 2B, each of the positive sensing elements (electrodes) 220-226 has the same distance from anchor center to electrode center as the corresponding negative sensing elements (electrodes) 230-236. Thus, any movement that is the same on both sides of this axis would result in an equal gap shift of the positive and negative electrodes because when a positive and a negative electrode move together, no net output is generated.

Therefore, perpendicular to axis 240, the negative sensing element 236 has the same distance as the positive sensing element 222 (so electrode 236 corresponds with electrode 222 perpendicular to axis 240), the negative sensing element 230 has the same distance as the positive sensing element 220 (so electrode 230 corresponds with electrode 220 perpendicular to axis 240), the negative sensing element 232 has the same radius as the positive sensing element 226 (so electrode 232 corresponds with electrode 226 perpendicular to axis 240), and the negative sensing element 234 has the same distance as the positive sensing element 224 (so electrode 234 corresponds with electrode 224 perpendicular to axis 240). Any motion, rotation, curvature or any combination thereof, that is centered perpendicular to axis 240 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 242. In other words, each corresponding positive and negative electrode has the same distance from any point to the axis 242. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 242, the negative sensing element 230 has the same distance as the positive sensing element 226 (so electrode 230 corresponds with electrode 226 perpendicular to axis 242), the negative sensing element 236 has the same distance as the positive sensing element 220 (so electrode 236 corresponds with electrode 220 perpendicular to axis 242), the negative sensing element 232 has the same distance as the positive sensing element 224 (so electrode 232 corresponds with electrode 224 perpendicular to axis 242), and the negative sensing element 234 has the same distance as the positive sensing element 222 (so electrode 234 corresponds with electrode 222 perpendicular to axis 242). Any motion, rotation, curvature or any combination thereof, that is centered about axis 242 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 244. In other words, each corresponding positive and negative electrode has the same distance from any point to the axis 244. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 244, the negative sensing element 230 has the same distance as the positive sensing element 224 (so electrode 230 corresponds with electrode 224 perpendicular to axis 244), the negative sensing element 236 has the same distance as the positive sensing element 226 (so electrode 236 corresponds with electrode 226 perpendicular to axis 244), the negative sensing element 232 has the same distance as the positive sensing element 222 (so electrode 232 corresponds with electrode 222 perpendicular to axis 244), and the negative sensing element 234 has the same distance as the positive sensing element 220 (so electrode 234 corresponds with electrode 220 perpendicular to axis 244). Any motion, rotation, curvature or any combination thereof, that is centered about axis 244 results in the positive sensing elements 220-226 moving in a similar fashion to the negative sensing element 230-236 thereby producing no net output and a zero offset with the differential sensing scheme.

In the top view 204 of FIG. 2B, each of the positive sensing elements (electrodes) 220-226 has the same distance as the corresponding negative sensing elements (electrodes) 230-236 perpendicular to axis 246. In other words, each corresponding positive and negative electrode has the same distance from any point to the axis 246. Also, the distance from the center of each of the positive sensing elements 220-226 to the center of the anchor 210 is the same as the distance from the center of each of the corresponding negative sensing elements 230-236 to the center of the anchor 210.

Therefore, perpendicular to axis 246, the negative sensing element 230 has the same distance as the positive sensing element 222 (so electrode 230 corresponds with electrode 222 perpendicular to axis 246), the negative sensing element 236 has the same distance as the positive sensing element 224 (so electrode 236 corresponds with electrode 224 perpendicular to axis 246), the negative sensing element 232 has the same distance as the positive sensing element 220 (so electrode 232 corresponds with electrode 220 perpendicular to axis 246), and the negative sensing element 234 has the same distance as the positive sensing element 226 (so electrode 234 corresponds with electrode 226 perpendicular to axis 246). Any motion, rotation, curvature or any combination thereof, that is centered about axis 246 results in the positive sensing elements 220-226 moving in a similar fashion to the negative sensing element 230-236 thereby producing no net output and a zero offset with the differential sensing scheme.

Figure 3A:
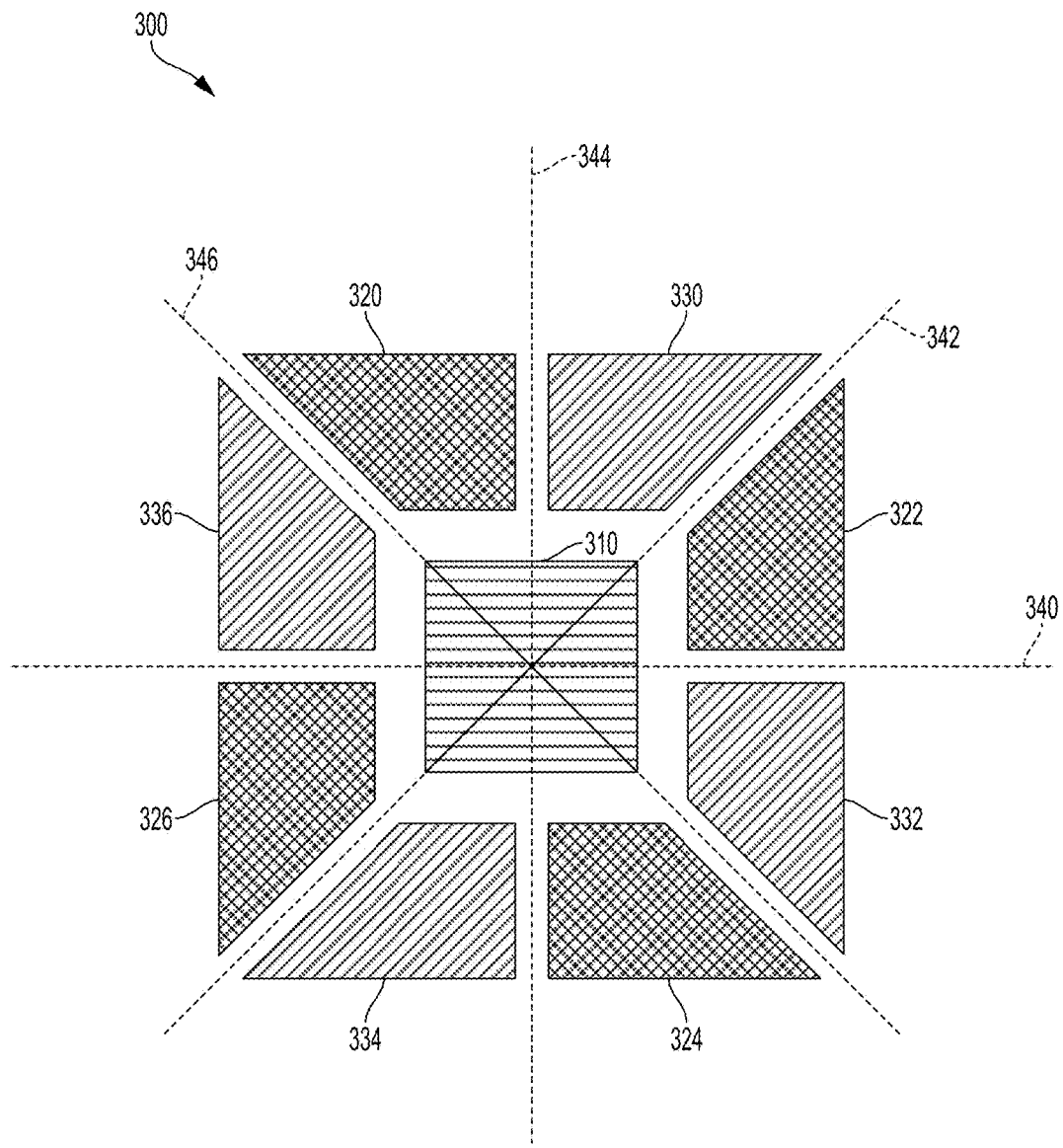
FIG. 3A illustrates a top view of a MEMS sensor with a pattern of sensing elements and the corresponding MEMS structure in accordance with another embodiment.

FIG. 3A illustrates a top view 300 of a MEMS sensor with a pattern of sensing elements and the corresponding MEMS structure in accordance with another embodiment. The top view 300 shows a top side of the pattern of sensing elements that comprise positive and negative electrodes. The top view 300 includes the anchor 310 of the MEMS sensor, positive electrodes 320, 322, 324, and 326, negative electrodes 330, 332, 334, and 336, and four axes of polarity anti-symmetry 340, 342, 344, and 346 denoted by the dashed lines. In FIG. 3A, the shape of the anchor 310 is square to correspond to the shape of the pattern of sensing elements which is also square.

In one embodiment, the MEMS sensor of FIG. 3A comprises a MEMS device coupled to a sensing reference plane via the anchor 310 thereby creating a gap between the MEMS device and the sensing reference plane. The MEMS device comprises a spring connected between the anchor 310 and a proof mass. The proof mass moves in the z axis in response to an external force that includes but is not limited to acceleration, magnetic field, Coriolis force, or pressure. The pattern of sensing elements comprises alternating positive and negative electrodes 320-326 and 330-336 on the sensing reference plane.

In this embodiment, the sensing elements 320-326 and 330-336 form a differential sensing scheme. Thus, motion is only detected if the gap between each pair of the positive electrode sensing elements 320-326 and the negative electrode sensing elements 330-336 and the MEMS device changes due to movement by the proof mass. When sensing acceleration, the proof mass moves in the same direction and in the same amount for each electrode pair (e.g., for positive sensing electrode 320 and negative sensing electrode 330). Therefore, the proof mass moves in a shape that causes detectable motion using the differential scheme of the pattern of sensing elements (electrodes). The center of each of the sensing elements 320-326 and 330-336 has a common distance from the center of the anchor 310. As aforementioned, the sensing elements 320-326 and 330-336 have four axes of anti-polarity symmetry 340-346. In another embodiment, the pattern of sensing elements is designed with three or less and five or more axes of symmetry.

In the top view 300 of FIG. 3A, each of the positive sensing elements (electrodes) 320-326 has the same distance as the corresponding negative sensing elements (electrodes) 330-336 perpendicular to axis 340. In other words, each corresponding positive and negative electrode has the same distance from any point to the axis 340. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 340, the negative sensing element 336 has the same distance as the positive sensing element 326 (so electrode 336 corresponds with electrode 326 perpendicular to axis 340), the negative sensing element 330 has the same distance as the positive sensing element 324 (so electrode 330 corresponds with electrode 324 perpendicular to axis 340), the negative sensing element 332 has the same distance as the positive sensing element 322 (so electrode 332 corresponds with electrode 322 perpendicular to axis 340), and the negative sensing element 334 has the same distance as the positive sensing element 320 (so electrode 334 corresponds with electrode 320 perpendicular to axis 3440). Any anchor rotation, curvature or any combination thereof, that is centered perpendicular to axis 340 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes)

330-336 perpendicular to axis 342. In other words, each corresponding positive and negative electrode has the same distance from any point to the axis 342. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 342, the negative sensing element 330 has the same distance as the positive sensing element 326 (so electrode 330 corresponds with electrode 326 perpendicular to axis 342), the negative sensing element 336 has the same distance as the positive sensing element 320 (so electrode 336 corresponds with electrode 320 perpendicular to axis 342), the negative sensing element 332 has the same distance as the positive sensing element 324 (so electrode 332 corresponds with electrode 324 perpendicular to axis 342), and the negative sensing element 334 has the same distance as the positive sensing element 322 (so electrode 334 corresponds with electrode 322 perpendicular to axis 342). Any motion, rotation, curvature or any combination thereof, that is centered about axis 342 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes) 330-336 perpendicular to axis 344. In other words, each corresponding positive and negative electrode has the same distance from any point to the axis 344. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 344, the negative sensing element 330 has the same distance as the positive sensing element 324 (so electrode 330 corresponds with electrode 320 perpendicular to axis 344), the negative sensing element 336 has the same distance as the positive sensing element 326 (so electrode 336 corresponds with electrode 326 perpendicular to axis 344), the negative sensing element 332 has the same distance as the positive sensing element 322 (so electrode 332 corresponds with electrode 322 perpendicular to axis 344), and the negative sensing element 334 has the same distance as the positive sensing element 320 (so electrode 334 corresponds with electrode 320 perpendicular to axis 344). Any motion, rotation, curvature or any combination thereof, that is centered about axis 344 results in the positive sensing elements 320-326 moving in a similar fashion to the negative sensing element 330-336 thereby producing no net output and a zero offset with the differential sensing scheme.

In the top view 300 of FIG. 3A, each of the positive sensing elements (electrodes) 320-326 has the same distance as the corresponding negative sensing elements (electrodes) 330-336 perpendicular to axis 346. In other words, each corresponding positive and negative electrode has the same distance from any point to the axis 346. Also, the distance from the center of each of the positive sensing elements 320-326 to the center of the anchor 310 is the same as the distance from the center of each of the corresponding negative sensing elements 330-336 to the center of the anchor 310.

Therefore, perpendicular to axis 346, the negative sensing element 330 has the same distance as the positive sensing element 322 (so electrode 330 corresponds with electrode 322 perpendicular to axis 346), the negative sensing element 336 has the same distance as the positive sensing element 324 (so electrode 336 corresponds with electrode 324 perpendicular to axis 346), the negative sensing element 332 has the same distance as the positive sensing element 320 (so electrode 332 corresponds with electrode 320 perpendicular to axis 346), and the negative sensing element 334 has the same distance as the positive sensing element 326 (so electrode 334 corresponds with electrode 326 perpendicular to axis 346). Any motion, rotation, curvature or any combination thereof, that is centered about axis 346 results in the positive sensing elements 320-326 moving in a similar fashion to the negative sensing element 330-336 thereby producing no net output and a zero offset with the differential sensing scheme.

Figure 3B:
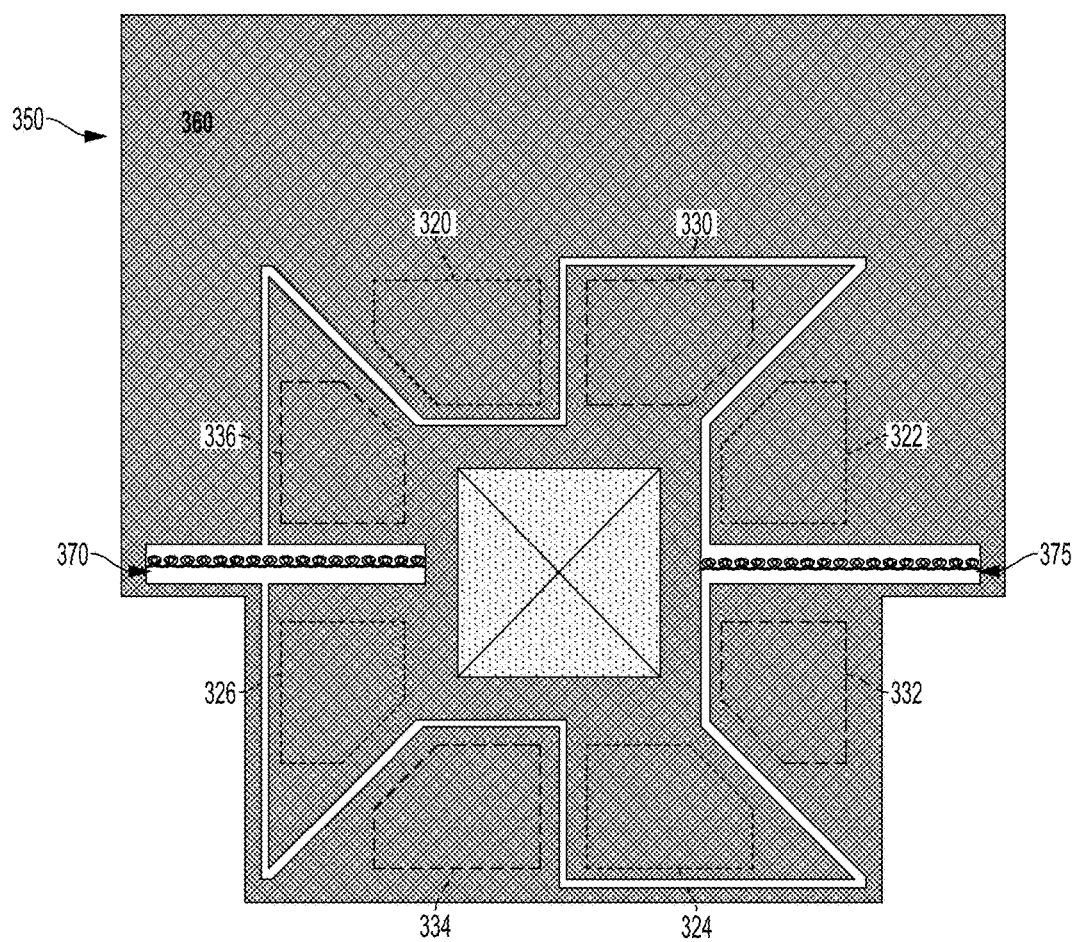
FIG. 3B illustrates a MEMS accelerometer structure of a MEMS sensor that uses an electrode pattern in accordance with an embodiment.

FIG. 3B illustrates a MEMS accelerometer structure 350 of a MEMS sensor that uses an electrode pattern in accordance with an embodiment. The MEMS accelerometer structure 350 resembles the MEMS device 250 in FIG. 2A. Under positive out-of-plane acceleration of the MEMS sensor, a proof mass 360 rotates about torsional springs 370 and 375 in a negative RX direction. This causes a decrease in a gap between positive sensing electrodes 320 and 322 and an increase in a gap between negative sensing electrodes 334 and 332, in reference to a sensing plane. In one embodiment, electrodes 324, 326, 330 and 336 are rigidly connected to an anchor and do not incur a gap change in response to an acceleration of the MEMS sensor. A signal processor combines electrodes 320-326 and 330-336 to output a signal proportional to the acceleration of the sensor.

In FIG. 3B, under anchor rotation of the MEMS sensor, as seen in the first non-ideal condition 104 of FIG. 1, all the electrodes 320-326 and 330-336 are connected to the anchor and move as a group similar to a flat plate as described in FIG. 3A about axes 340, 344, and 346. A signal processor combines electrodes 320-326 and 330-336 and no net output is generated if the anchor rotation or sensing reference plane curvature is centered about the axes 340-346. In this embodiment, the electrodes 320, 322, 332 and 334 are used to detect acceleration of the MEMS sensor and electrodes 320-326, 330-336 are used to reject offset caused from anchor rotation or sensing reference plane curvature.

Figure 4:
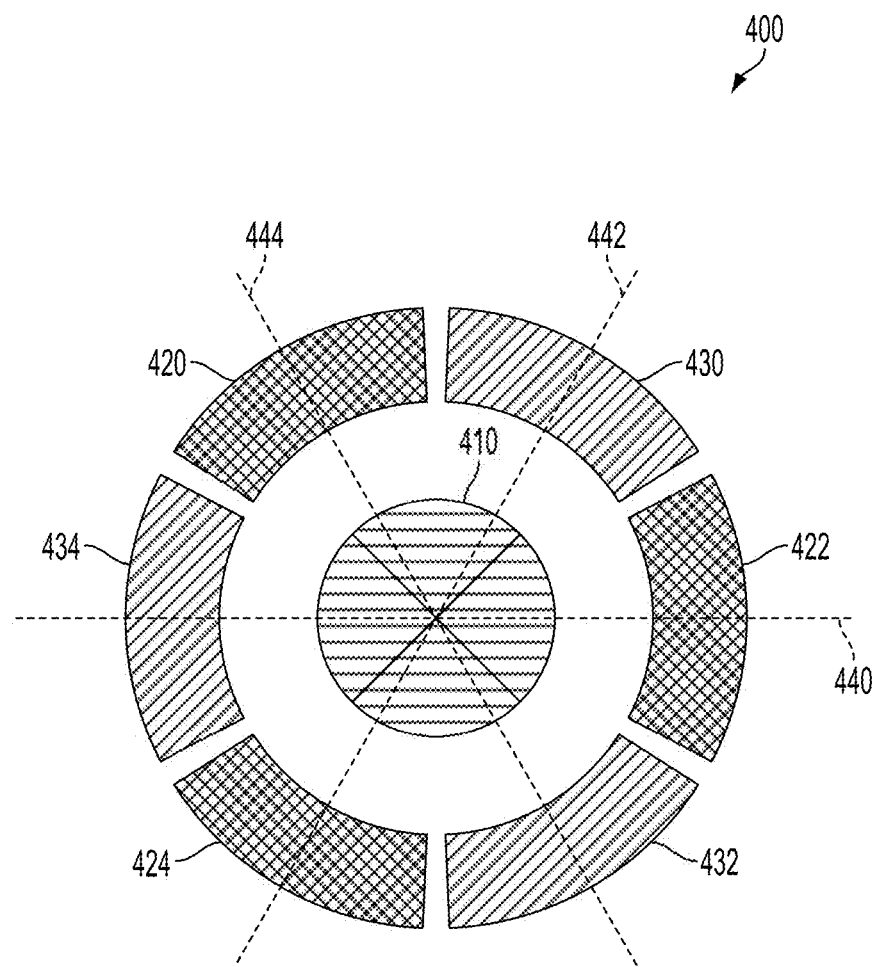
FIG. 4 illustrates a top view of a MEMS sensor with a pattern of sensing elements in accordance with another embodiment.

FIG. 4 illustrates a top view 400 of a MEMS sensor with a pattern of sensing elements in accordance with another embodiment. The top view 400 shows a top side of the pattern of sensing elements that comprise positive and negative electrodes. The top view 400 includes the anchor 410 of the MEMS sensor, positive electrodes 420, 422, and 424, negative electrodes 430, 432, and 434, and three axes of anti-polarity symmetry 440, 442, and 444 denoted by the dashed lines. In FIG. 4, the shape of the anchor 410 is circular to correspond to the shape of the pattern of sensing elements which is also circular.

In one embodiment, the MEMS sensor of FIG. 4 comprises a MEMS device coupled to a sensing reference plane via the anchor 410 thereby creating a gap between the MEMS device and the sensing reference plane. The MEMS device comprises a spring connected between the anchor 410 and a proof mass. The proof mass moves in the z axis to an external force that includes but is not limited to acceleration, magnetic field, Coriolis force, pressure, and many others. The pattern of sensing elements comprise alternating positive and negative electrodes 420-424 and 430-434 and are connected between the MEMS device and the sensing reference plane. The positive electrode sensing elements 420-424 detect positive movements and the negative electrode sensing elements 430-434 detect negative movements.

In this embodiment, the sensing elements 420-424 and 430-434 form a differential sensing scheme. Thus, motion is only detected if the positive electrode sensing elements 420-424 move relative to the negative electrode sensing elements 430-434. The proof mass moves in a shape that causes detectable motion using the differential scheme of the pattern of sensing elements (electrodes). The center of each of the sensing elements 420-424 and 430-434 has a common radius from the center of the anchor 410. As aforementioned, the sensing elements 420-424 and 430-434 have three axes of anti-polarity symmetry 440-444.

In the top view 400 of FIG. 4, each of the positive sensing elements (electrodes) 420-424 has the same distance as the corresponding negative sensing elements (electrodes) 430-434 perpendicular to axis 440. In other words, each corresponding positive and negative electrode has the same distance from any point to the axis 440. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 440, the negative sensing element 430 has the same distance as the positive sensing element 420 (so electrode 430 corresponds with electrode 420 perpendicular to axis 440), the negative sensing element 432 has the same distance as the positive sensing element 424 (so electrode 432 corresponds with electrode 424 perpendicular to axis 440) and the negative sensing element 434 has the same distance as the positive sensing element 422 (so electrode 434 corresponds with electrode 422 perpendicular to axis 440). Any motion, rotation, curvature or any combination thereof, that is centered about axis 440 results in the positive sensing elements 420-424 moving in a similar fashion to the negative sensing element 430-434 thereby producing no net output and a zero offset with the differential sensing scheme.

In the top view 400 of FIG. 4, each of the positive sensing elements (electrodes) 420-424 has the same distance as the corresponding negative sensing elements (electrodes) 430-434 perpendicular to axis 442. In other words, each corresponding positive and negative electrode has the same distance from any point to the axis 442. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 442, the negative sensing element 434 has the same distance as the positive sensing element 420 (so electrode 434 corresponds with electrode 420 perpendicular to axis 442), the negative sensing element 432 has the same distance as the positive sensing element 422 (so electrode 432 corresponds with electrode 422 perpendicular to axis 442) and the negative sensing element 430 has the same distance as the positive sensing element 424 (so electrode 430 corresponds with electrode 424 perpendicular to axis 442) Any motion, rotation, curvature or any combination thereof, that is centered about axis 442 results in the positive sensing elements 420-424 moving in a similar fashion to the negative sensing element 430-434 thereby producing no net output and a zero offset with the differential sensing scheme.

In the top view 400 of FIG. 4, each of the positive sensing elements (electrodes) 420-424 has the same distance as the corresponding negative sensing elements (electrodes) 430-434 perpendicular to axis 444. In other words, each corresponding positive and negative electrode has the same distance from any point to the axis 444. Also, the distance from the center of each of the positive sensing elements 420-424 to the center of the anchor 410 is the same as the distance from the center of each of the corresponding negative sensing elements 430-434 to the center of the anchor 410.

Therefore, perpendicular to axis 444, the negative sensing element 434 has the same distance as the positive sensing element 424 (so electrode 434 corresponds with electrode 424 perpendicular to axis 444), the negative sensing element 430 has the same distance as the positive sensing element 422 (so electrode 430 corresponds with electrode 422 perpendicular to axis 444) and the negative sensing element 432 has the same distance as the positive sensing element 420 (so electrode 432 corresponds with electrode 420 perpendicular to axis 444) Any motion, rotation, curvature or any combination thereof, that is centered about axis 444 results in the positive sensing elements 420-424 moving in a similar fashion to the negative sensing element 430-434 thereby producing no net output and a zero offset with the differential sensing scheme.

Figure 5:
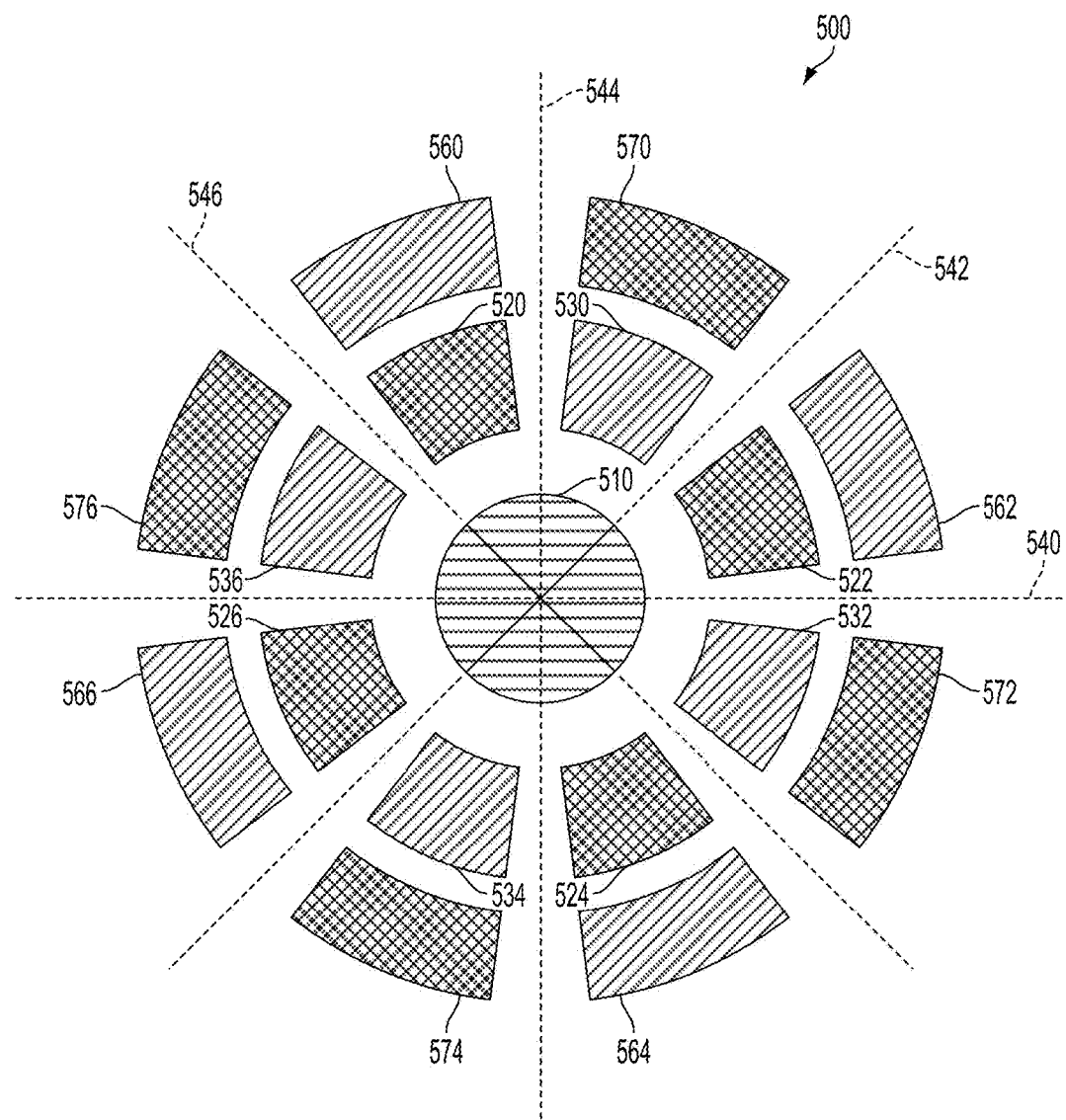
FIG. 5 illustrates a top view of a MEMS sensor with a pattern of sensing elements in accordance with another embodiment.

FIG. 5 illustrates a top view 500 of a MEMS sensor with a pattern of sensing elements in accordance with another embodiment. The top view 500 shows a top side of two independent patterns of sensing elements that comprise positive and negative electrodes. The top view 500 includes the anchor 510 of the MEMS sensor, positive electrodes 520, 522, 524, and 526 in the first pattern, negative electrodes 530, 532, 534, and 536 in the first pattern, positive electrodes 570, 572, 574, and 576 in the second pattern, negative electrodes 560, 562, 564, and 566 in the second pattern, and four axes of anti-polarity symmetry 540, 542, 544, and 546 denoted by the dashed lines. In FIG. 5, the shape of the anchor 510 is circular to correspond to the shape of the two independent patterns of sensing elements which are also circular. In another embodiment, the two patterns of sensing elements work in conjunction with each other and thus are dependent on each other.

In FIG. 5, the first pattern of sensing elements that comprises alternating positive electrodes 520-526 and negative electrodes 530-536 work in similar fashion as the pattern of sensing elements (220-226 and 230-236) in the top view 204 of FIG. 2. Additionally, the second pattern of sensing elements that comprises alternating positive electrodes 570-576 and negative electrodes 560-566 work in similar fashion as the pattern of sensing elements (220-226 and 230-236) in the top view 204 of FIG. 2 but add an additional level of sensitivity to further reduce the offset utilizing a dual differential sensing scheme. One of ordinary skill in the art readily recognizes that the electrodes of the first and/or the second patterns of sensing elements could be reorganized and that would be within the scope of the present embodiment.

Figure 6:
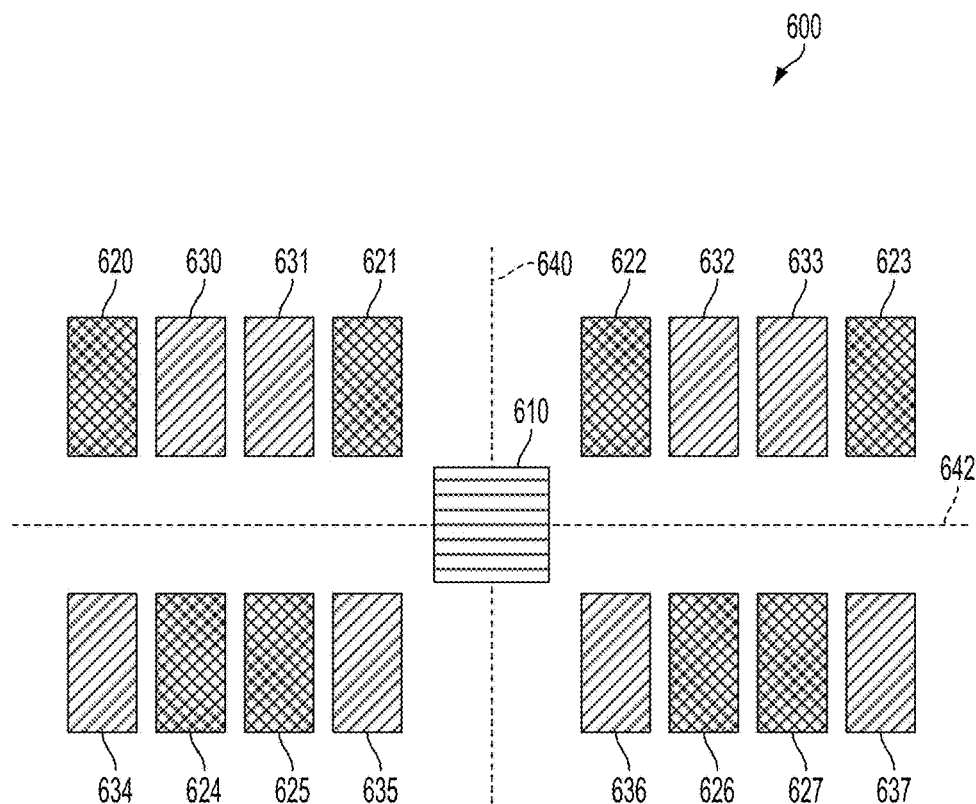
FIG. 6 illustrates a top view of a MEMS sensor with a pattern of sensing elements in accordance with another embodiment.

FIG. 6 illustrates a top view 600 of a MEMS sensor with a pattern of sensing elements in accordance with another embodiment. The top view 600 shows a top side of a pattern of sensing elements that comprise positive and negative electrodes in four quadrants that are divided by two axes 640 (y-axis) and 642 (x-axis) denoted by the dashed lines. The top view 600 includes the anchor 610 of the MEMS sensor, positive electrodes 620-621 and negative electrodes 630-631 in the first quadrant (upper left), positive electrodes 622-623 and negative electrodes 632-633 in the second quadrant (upper right), positive electrodes 624-625 and negative electrodes 634-635 in the third quadrant (lower left), and positive electrodes 626-627 and negative electrodes 636-637 in the fourth quadrant (lower right).

In FIG. 6, the positive electrodes 620-627 have a 'W' shape centered about the center of the anchor 610 and the negative electrodes 630-637 have an 'M' shape centered about the center of the anchor 610. The negative electrodes 630-637 are interwoven with the positive electrodes 620-627 to create the pattern of sensing elements that reduces the offset cause by undesirable conditions.

Due to the pattern of sensing elements of FIG. 6, any rotation that is centered about axis 642 produces no net output and a zero offset because positive electrodes 620-623 share the same distance (distance defined as the perpendicular distance between the electrode center and the axis) as negative electrodes 630-633 and positive electrodes 624-627 share the same distance as negative electrodes 634-637. Any curvature along axis 642 produces no net output and a zero offset because distance positive electrodes 620-623 share the same distance as negative electrodes 630-633 and positive electrodes 624-627 share the same distance as negative electrodes 634-637. Likewise, any curvature along axis 640 produces no net output and a zero offset because positive electrodes 620-621 and 624-625 share the same distance as negative electrodes 630-631 and 634-635, and positive electrodes 622-623 and 626-627 share the same distance as negative electrodes 632-633 and 636-637; and any rotation that is centered perpendicular to axis 640 produces no net output and a zero offset because positive electrodes 620-621 and 624-625 share the same distance as negative electrodes 630-631 and 634-635, and positive electrodes 622-623 and 626-627 share the same distance as negative electrodes 632-633 and 636-637 distance.

In one embodiment, electrodes 630 and 631 are joined into one electrode, electrodes 624 and 625 are joined into one electrode, electrodes 632 and 633 are joined into one electrode and electrodes 626 and 627 are joined into one electrode.

In a first embodiment, a MEMS sensor comprises a sensing reference plane, at least one anchor coupled to the sensing reference plane, and at least one proof mass coupled to the at least one anchor, wherein one of the at least one proof mass moves under an external excitation. The MEMS sensor further comprises a pattern of sensing elements (or sensing electrodes) that lies on the sensing reference plane or is coupled between the sensing reference plane and the at least one proof mass to detect motion of the at least one proof mass normal to the sensing reference plane, wherein the pattern of sensing elements shares at least three axes of polarity anti-symmetry. The MEMS sensor further comprises a signal processing circuit to combine the pattern of sensing elements thereby providing an output proportional to the external excitation. In one embodiment, the output is a difference between positive and negative sensing elements of the pattern of sensing elements.

In one embodiment, the at least one proof mass is coupled to the at least one anchor by at least one spring. In one embodiment, the pattern of sensing elements share any of one, two, three, four, and five or greater axes of polarity anti-symmetry. In one embodiment, a centroid of each sensing element shares a common distance to a center of the at least one anchor. In one embodiment, the pattern of sensing elements comprising sensing electrodes forming a variable capacitor between each electrode and the at least one proof mass.

In one embodiment, the pattern of sensing electrodes comprise alternating positive and negative electrodes and in another embodiment, the positive and negative electrodes are not alternating and instead can include two or more positive and/or two or more negative electrodes next to each other. In one embodiment, the pattern of sensing electrodes comprises at least three positive sensing electrodes and at least three negative sensing electrodes that are alternating.

In one embodiment, each negative sensing element/electrode has the same area as each positive sensing element/electrode and in another embodiment, each negative sensing element/electrode has substantially the same electrode area as each positive sensing element/electrode. In one embodiment, the sensing electrodes are any of capacitive sensing, piezoresistive sensing, and magnetic sensing electrodes. In one embodiment, a center of each of the sensing electrodes is on a perimeter of any of a circle, rectangle, square, hexagon, octagon, and other polygon and the sensing electrodes themselves are any of circular, rectangular, square, hexagonal, octagonal, annular sector, and polygonal in shape.

In one embodiment, the MEMS sensor further comprises a second pattern of sensing elements on the sensing reference plane to detect the motion of the at least one proof mass relative to the sensing reference plane, wherein each sensing element of the second pattern of sensing elements shares at least three axes of polarity anti-symmetry and further wherein a centroid of each sensing element of the second pattern of sensing elements shares a second common distance to the center of the at least one anchor. In another embodiment, the MEMS sensor comprises a plurality of patterns of sensing elements that are coupled either on top of each other or next to each other to further reduce the offset.

In a second embodiment, the sensing reference plane of the MEMS sensor is divided by two axes (a first and a second axis) forming four quadrants on the sensing reference plane and the pattern of sensing elements comprises at least three sensing elements in each of the four quadrants to detect motion of the at least one proof mass relative to the sensing reference plane. In this embodiment, the MEMS sensor includes at least one anchor coupled to the sensing reference plane and at least one proof mass coupled to the at least one anchor, wherein one of the at least one proof mass moves under an external excitation. Each of the four quadrants includes two outside sensing electrodes of a first polarity and two inside sensing electrodes of a second polarity. The first polarity is opposite of the second polarity and there is polarity anti-symmetry of the at least three sensing elements in each of the four quadrants.

In one embodiment, in each of the four quadrants the closest sensing element and the furthest sensing element, relative to one of the first or second axes, is of a first polarity and in between the first polarity there is at least one sensing element of a second polarity. In one embodiment, the first polarity is opposite of the second polarity and there is polarity anti-symmetry of the four quadrants about at least one of the first or the second axis. In one embodiment, a center of the at least one anchor coincides with an intersection of the first and the second axis. In one embodiment, a centroid of the at least three sensing elements in each of the four quadrants shares a common distance from at least one of the first or the second axis. In one embodiment, a sensing element area is substantially the same between the first and the second polarity.

In one embodiment, the pattern of sensing elements comprises a first and a second pattern, wherein the first pattern is a M-shaped polarity pattern centered about the at least one anchor and the second pattern is a W-shaped polarity pattern centered about the at least one anchor. In one embodiment, at least a portion of the at least four sensing elements in each of the four quadrants is in a straight line and in another embodiment, at least a portion of the at least four sensing elements in each of the four quadrants is in a non-straight line and/or orientation.

The sensing elements of the at least four sensing elements that have opposite polarities share a common distance from one of the lines of symmetry. In one embodiment, the at least four sensing elements are any of circular, rectangular, square, hexagonal, octagonal, and polygonal in shape. In another embodiment, the sensing reference plane is not divided into any quadrants and the pattern of sensing elements instead comprises two sets of at least four sensing elements that are on the same axis and on opposite sides of the at least one anchor.

As above described, a system (MEMS sensor) and a method in accordance with the present embodiment utilizes a plurality of patterns of sensing elements (electrodes) on a sensing reference plane to reduce the adverse effects of deviations in parallel alignment between the MEMS device of the MEMS sensor and the sensing reference plane that occur due to various undesirable forces. The deviations in parallel alignment cause offsets and each of the plurality of patterns produces no net output and improves offset rejection (provides a zero or reduced offset) by utilizing a plurality of sensing schemes that counteract the detected rotational and/or curvature type forces.

The embodiments described above minimize offset and reject unwanted exogenous forces with motion with respect to the symmetry axis line. Unfortunately, the offset is not minimized when the motions are about an axis that is in between the symmetry axis line(s). Partial symmetry for the sensing elements may be used to achieve a more uniform offset with reduced variation in the offset regardless of whether the motions are about an axis in between the symmetry axis line(s) or about the symmetry axis line. Partial symmetry for the sensing elements according to some embodiments is a tradeoff between performance when motions are with respect to an axis about the symmetry axis line, as described above with respect to FIGS. 1-6, and when motions are with respect to an axis in between the symmetry axis line(s) as is described below. In other words, the offset is increased for motions at symmetry axis line(s) in the embodiments described in FIGS. 1-6 as a tradeoff for better performance, hence smaller offset, for motions that are with respect to an axis that is in between the symmetry axis line(s) as is described with respect to FIGS. 7-13C. In partial symmetry, the perfect symmetry, as described in FIGS. 1-6 is broken. Partial symmetry with respect to an axis line can be defined by the following equation:

$$\text{Sym} \geq \left| \sum_{i=electrodes} P_i \frac{dc}{dz_i} f(r_i) \right| \geq 0. \tag{1}$$

Polarity of the sensing element may be represented by $P_i$. The capacitive sensitivity may be represented by $$\frac{dc}{dz_i}$$

and $f(r_i)$ is a function that defines a distance of the sensing element with respect to the axis line. For example, the distance of the sensing element may be defined by a function of a radius with respect to the axis line. It is appreciated that the capacitive sensitivity may be illustrated by the following equation:

$$\frac{dc}{dz_i} = \frac{\varepsilon_0 A_i}{g_i^2}. \tag{2}$$

It is appreciated that $A_i$ may be the area associated with the sensing element, $g_i$ is the gap across distance between the sensing element between the proof mass and reference plane, and $\varepsilon_0$ is permittivity of the dielectric.

Accordingly, the partial symmetry for the sensing elements may be configured by controlling the area associated with each sensing element, the polarity of each sensing element, the gap between each sensing element and the proof mass, and a function defining the distance of each sensing element to the axis line, e.g., a function of a radius. In some embodiments, the function of the distance may be more complex and defined by a more complex equation such as a polynomial illustrated below:

$$f(r) = Br + Dr^2 + Er^3 + \ldots \tag{3}.$$

It is appreciated that in a perfect symmetrical configuration with respect to an axis, as described in FIGS. 1-6, equation (1) result in a symmetry which is 0 because the sensing elements cancel out offsets from one another. However, in a partial symmetrical configuration as is discussed with respect to FIGS. 7-13C, the symmetry is a nonzero value. In some embodiments, the symmetry may be expressed as a value, e.g., normalized value, percentage, etc. In some embodiments, equation (1) may be used for both the partial symmetrical configuration and the perfect symmetry configuration in order to determine the Sym value which may be a percentage value that may be a comparison between the partial symmetry versus the perfect symmetry. For example, a Sym percentage of 5%-10% may indicate high symmetrical correlation between the partial symmetry and perfect symmetry with minor asymmetry in order to adjust the offset, therefore resulting in a tradeoff for motions with respect to axis about the symmetry axis line with motions that are in between the symmetry axis line. In some embodiments, the Sym percentage may be greater 0 but less than 5%. It is also appreciated that in some embodiments, the Sym value may be associated with each section created by the axis line in a partial symmetrical configuration. For example, an axis line may create two sections that are partially symmetrical with respect to one another. Thus, a Sym percentage of 5%-10% may indicate high symmetrical correlation between a first and a second sections created by the axis line. In some embodiments, the Sym associated with the two sections created by the axis line may be greater 0 but less than 5%.

It is therefore appreciated that the partial symmetry configuration for the sensing elements results in a slightly inferior offset with respect to motions at axis about the symmetry axis line but a better offset with respect to motions that are in between the symmetry axis line. In other words, the offset at axis about the symmetry axis line is substantially the same as the offset for motions that are in between the symmetry axis line, resulting in a uniform offset line with very minor variations, if any. In some embodiments, the offset line is substantially a straight line where the offset value is constant for curvature angles of the sensing reference plane that ranges between 0° to 360° degrees. It is appreciated that the offset resulting from the partial symmetry configuration is less than the maximum offset that occurs for motions in between the symmetry axis lines for the perfect symmetry configuration of sensing elements. In other words, the offset values for curvature angles of the sensing reference plane ranging between 0° to 360° degrees is less than the maximum offset value that occurs for motions in between the symmetry axis lines for perfect symmetry configuration.

Figure 7:
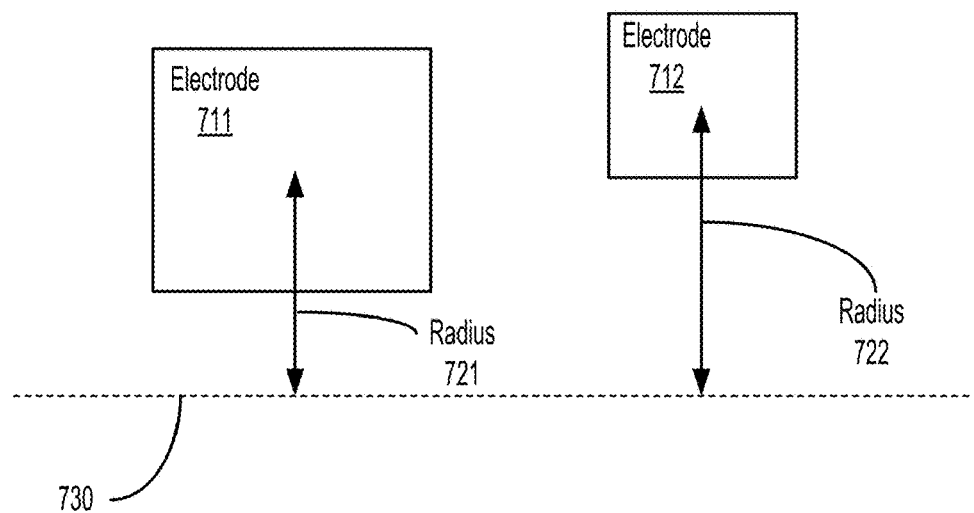
FIG. 7 illustrates a top view of a MEMS sensor in accordance with some embodiments.

Referring now to FIG. 7 a top view of a MEMS sensor in accordance with some embodiments is shown. Equations (1)-(3) are illustrated with respect to the partial symmetry configuration of FIG. 7. FIG. 7 shows a sensor with electrodes 711 and 712, also interchangeably referred to as sensing elements. Electrode 711 is at a radius 721 away from the axis line 730 and the electrode 712 is at a radius 722 away from the axis line 730. It is appreciated that the radius may be from the center of the electrode or in some embodiments from an edge, e.g., closest edge to the axis line, farthest edge to the axis line, etc., of the electrode. Assuming that electrode 711 has a positive polarity and that electrode 712 has a negative polarity, and further assuming that the gap between each electrode and the proof mass is the same, and further assuming that the function defining the distance of each electrode to the axis line is function of the radius then equation (1)-(3) result in:

$$\mathrm{Sym} \geq |A_{711} r_{721} - A_{712} r_{722}| \geq 0. \quad (4)$$

Where $A_{711}$ is the area associated with electrode 711, $A_{712}$ is the area associated with electrode 712, $r_{721}$ is the radius of electrode 711, and $r_{722}$ is the radius of electrode 712. It is appreciated that the two electrodes as seen are subtracted from one another because one has a positive polarity and the other has a negative polarity. It is appreciated that in a perfect symmetrical configuration subtraction of the two electrodes in FIG. 7 results in a 0 value, therefore a 0 offset for motions about the symmetry axis line but a higher offset value for motions in between the symmetry axis line(s) whereas in partial symmetry configuration the offset value is higher for motions about the symmetry axis line but lower for motions in between the symmetry axis line(s), therefore creating a substantially constant offset and overall a better performance for curvature angles of the sensing reference plane that ranges between 0° to 360° degrees.

It is appreciated that equations (1)-(3) under the same presumptions but for a function that defines the distance of each electrode to the axis line a polynomial radius function results in:

$$\mathrm{Sym} \geq |A_{711}(Br_{721}+Dr_{721}^2+Er_{721}^3) - A_{712}(Br_{722}+Dr_{722}^2+Er_{722}^3)| \geq 0. \quad (5)$$

Where $Br_{721}+Dr_{721}^2, +Er_{721}^3$ is the polynomial function that describes the distance between the electrode 721 and the axis line in some embodiments. It is appreciated that $Br_{722}+Dr_{722}^2+Er_{722}^3$ may be the polynomial function that describes the distance between the electrode 722 and the axis line in some embodiments. It is appreciated that other functions may similarly be used and the functions as described herein are for illustrative purposes only and the embodiments should not be construed as limiting the scope. It is appreciated that the two electrodes as seen are subtracted from one another because one has a positive polarity and the other has a negative polarity. It is appreciated that in a perfect symmetrical configuration subtraction of the two electrodes in FIG. 7 results in a 0 value, therefore a 0 offset for motions about the symmetry axis line but a higher offset value for motions in between the symmetry axis line(s) whereas in partial symmetry configuration the offset value is higher for motions about the symmetry axis line but lower for motions in between the symmetry axis line(s), therefore creating a substantially constant offset and overall a better performance for curvature angles of the sensing reference plane that ranges between 0° to 360° degrees. If all the electrodes have the same area and have the same radius then all poly-nominal coefficients result is a zero output, like those in FIG. 2-6. In a partial symmetry, there exists at least one polynomial that would sum to zero and at least one other that would sum to a non-zero. By understanding the critical polynomials that describe the realistic curving or tilting surfaces, partial symmetry electrode patterns can be a more effective solution that symmetric electrode patterns, like those of FIG. 2-6. In the symmetric electrode patterns, like those of FIG. 2-6, there are three or more axes where any polynomial in Eq. 5 would sum to zero.

Figure 8:
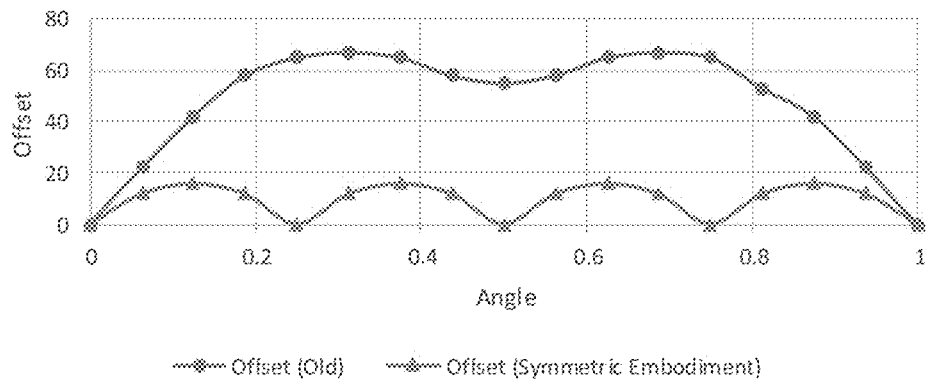
FIG. 8 shows an illustrative performance of highly symmetrical sensing elements of a MEMS sensor in accordance to some embodiments to highly unsymmetrical sensing elements of a MEMS sensor.

Referring now to FIG. 8, an illustrative performance of highly symmetrical sensing elements of a MEMS sensor in accordance to some embodiments to highly unsymmetrical sensing elements of a MEMS sensor is shown. As illustrated, the highly symmetrical configuration of the sensing elements reduces the offset for curvature angles of the sensing reference plane that ranges between 0° to 360° degrees. However, as illustrated, there is a variation between the offset at about the axis of symmetry in comparison to motions in between the symmetry axis line(s). In order to reduce the variations, e.g., peaks and valleys of the perfect symmetrical configuration, partial symmetry for the sensing elements may be used.

Figure 9:
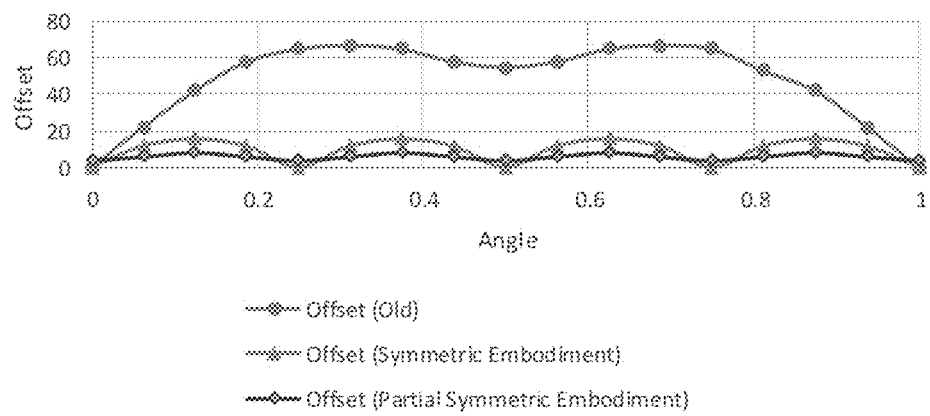
FIG. 9 shows an illustrative performance of partially symmetrical sensing elements of a MEMS sensor to highly symmetrical sensing elements of a MEMS sensor in accordance to some embodiments to highly unsymmetrical sensing elements of a MEMS sensor.

Referring now to FIG. 9, an illustrative performance of partially symmetrical sensing elements of a MEMS sensor to highly symmetrical sensing elements of a MEMS sensor in accordance to some embodiments to highly unsymmetrical sensing elements of a MEMS sensor is shown. As illustrated, partial symmetry results in a more uniform and constant offset that is less than the maximum offset that occurs for motions in between the symmetry axis line(s) for the perfect symmetry configuration. In other words, the variation between the peaks and valleys is reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Figure 10A:
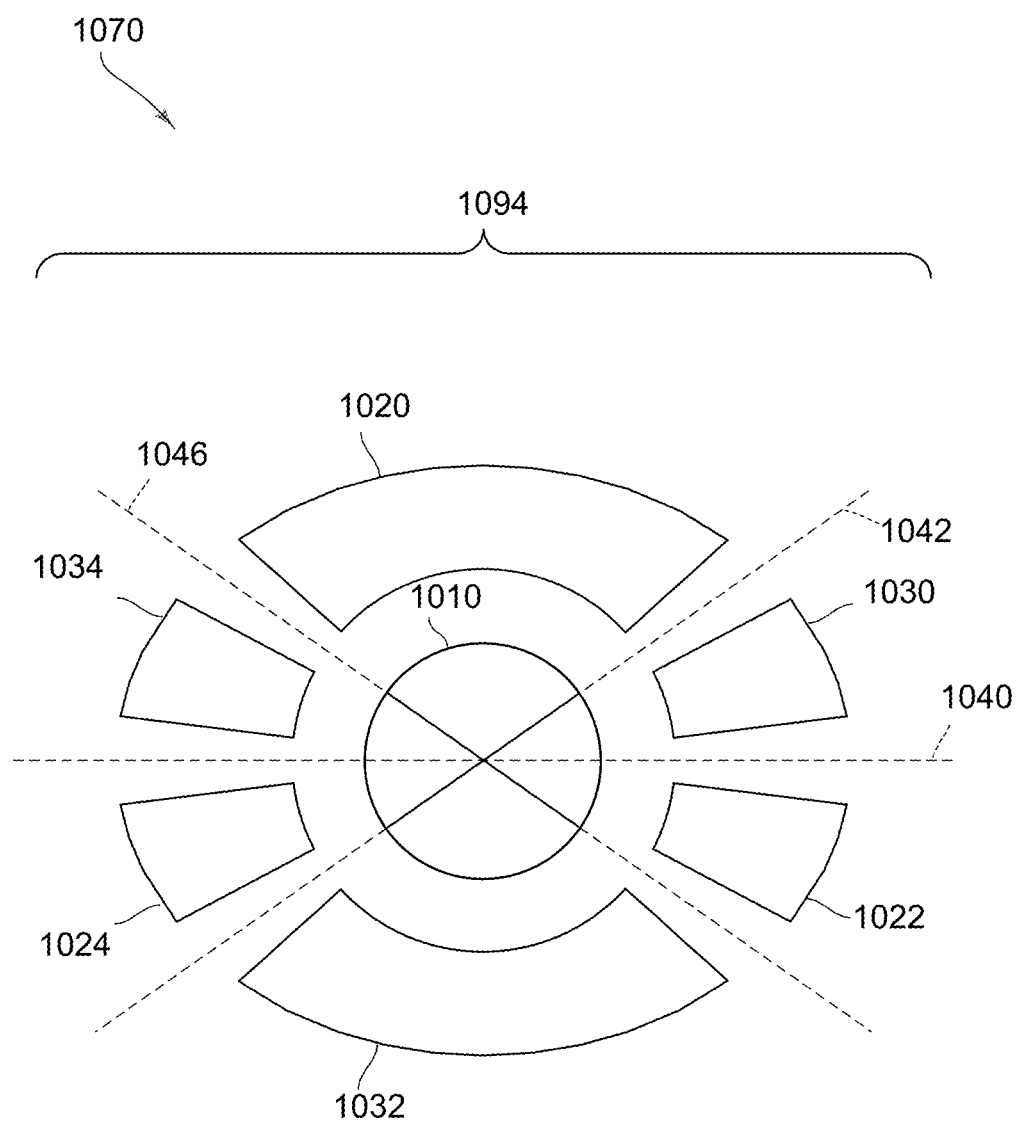
FIGS. 10A-10C show a top view of MEMS sensor with a pattern of partial symmetry for sensing elements in accordance with some embodiments.
Figure 10B:
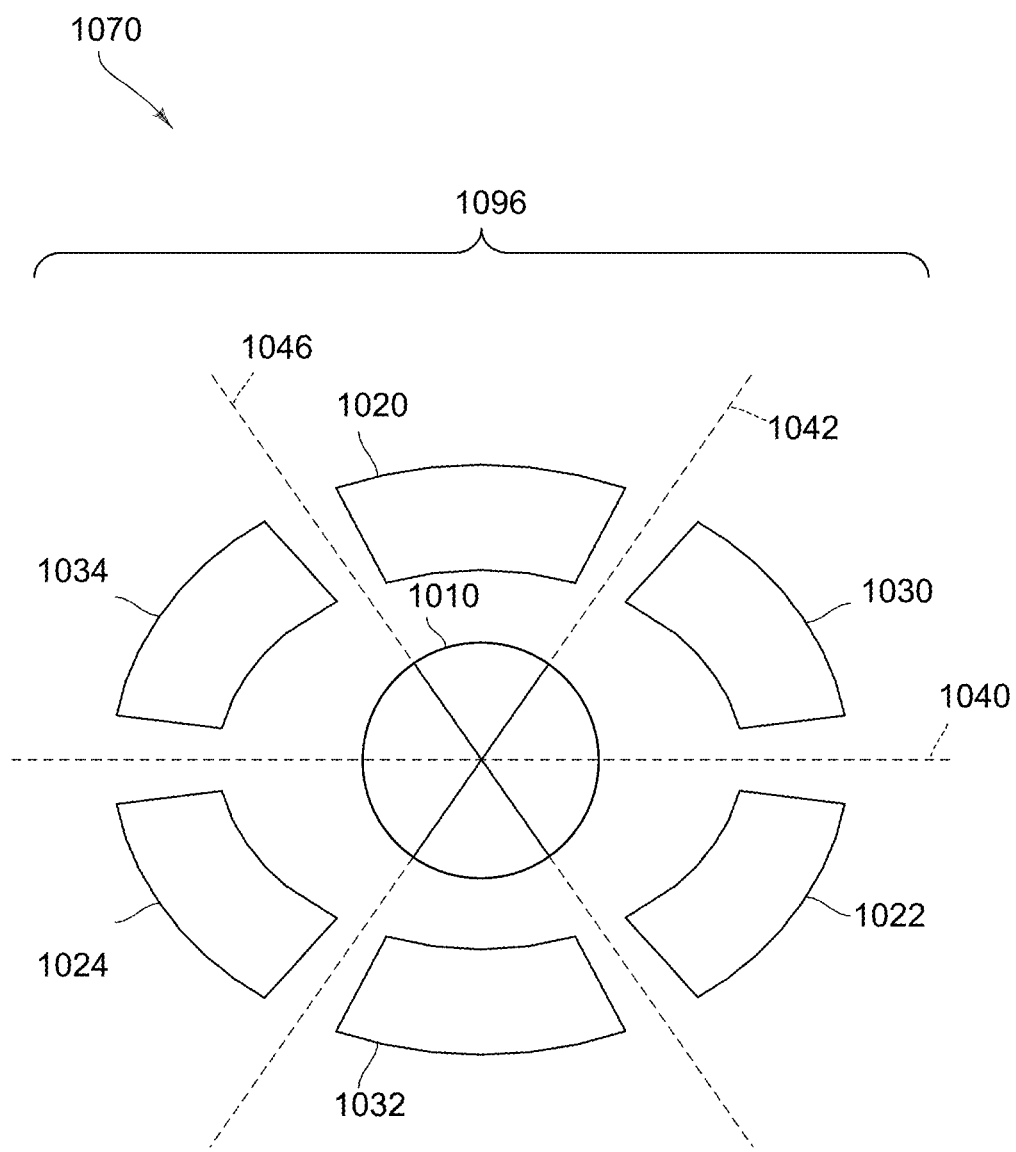
Figure 10C:
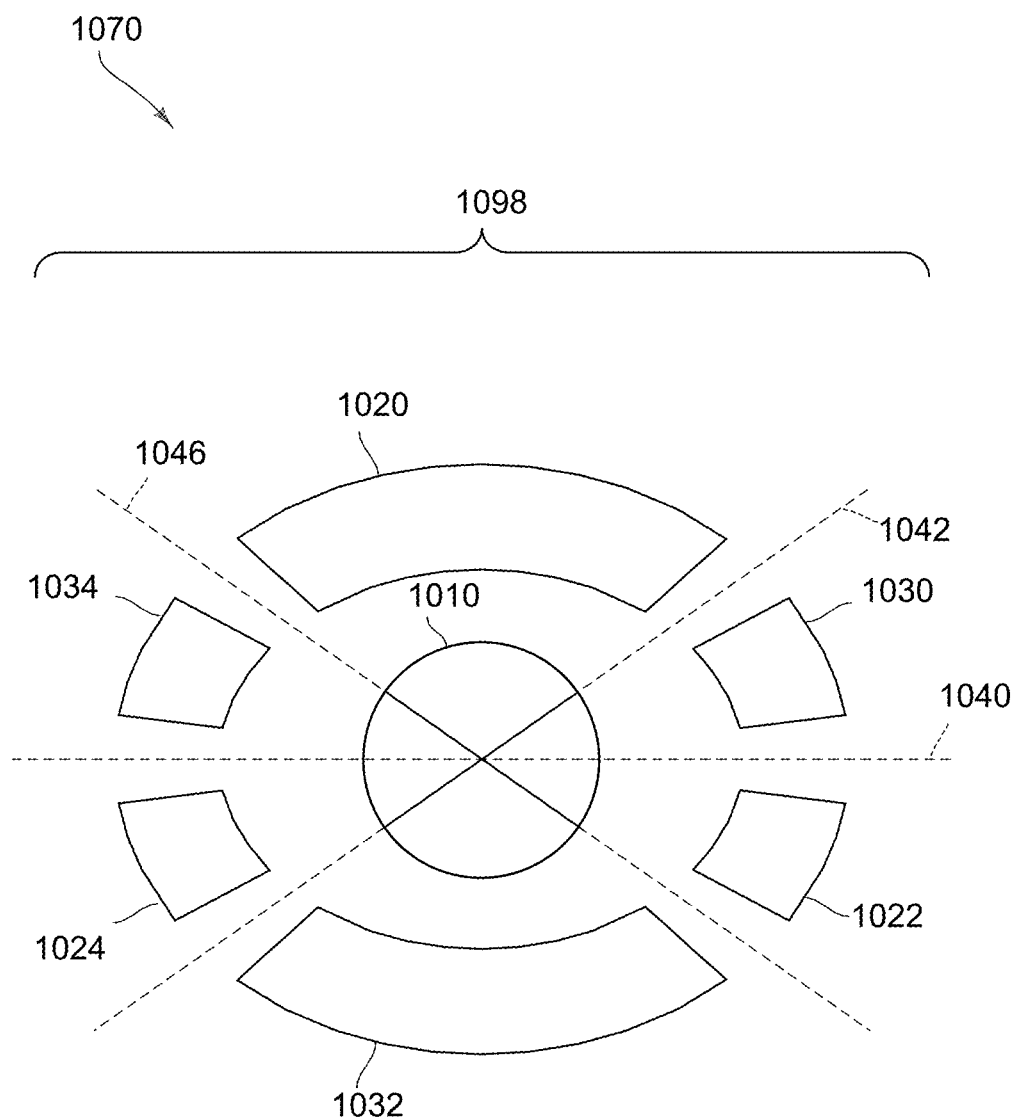

Referring now to FIGS. 10A-10C, a top view of MEMS sensor with a pattern of partial symmetry for sensing elements in accordance with some embodiments. FIG. 10A illustrates a diagram 1070 with a top view 1094 of a substrate portion of a MEMS sensor with a pattern of sensing elements in accordance with an embodiment. The top view 1094 shows a top view of AA which results in a top side of the pattern of sensing elements that comprise positive and negative electrodes. The top view 1094 includes the anchor 1010 of the MEMS sensor, positive electrodes 1020, 1022, and 1024, negative electrodes 1030, 1032, and 1034, and three axes of partial symmetry 1040, 1042, and 1046 denoted by the dashed lines. It is appreciated that the shape of the anchor 1010 is circular in this embodiment but it may have any shape and the circular shape of the anchor should not be construed as limiting the scope of the embodiments.

In this embodiment, the circular shape of the anchor 1010 creates partial symmetry with the electrodes 1020-1034 due to their elliptical shape.

In one embodiment, the MEMS device comprises a spring connected between the anchor 1010 and a proof mass. The proof mass moves in the z axis to an external force that includes but is not limited to acceleration, magnetic, Coriolis, pressure, and many others. The pattern of sensing elements comprises alternating positive and negative electrodes 1020-1024 and 1030-1034 and are connected between the MEMS device and the sensing reference plane 260. The positive electrode sensing elements 1020-1024 detect positive movements and the negative electrode sensing elements 1030-1034 detect negative movements. In one embodiment, the shape of the electrode sensing elements 1020-1024 and 1030-1034 are annular/elliptical sectors.

It is appreciated that the electrodes 1020-1034 in this embodiment are within the same distance or radius from the anchor 1010. However, the areas associated with each electrode are different to create the partial symmetry as discussed above. It is appreciated that the area of each electrode is grossly exaggerated for illustrative purposes. However, it is appreciated that the configuration of the electrodes is such that they are highly symmetrical with slight asymmetry between them as illustrated by different areas associated with each electrode. It is further appreciated that equations (1)-(3) may similarly be used to illustrate the partial symmetry that exists between the electrodes. As such, the variation between the peaks and valleys are reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Referring now to FIG. 10B, a configuration similar to that of FIG. 10A is shown except that the areas for the electrodes 1020-1034 are the same, however, the distance between each electrode and an axis line is different to form the partial symmetry, as described above. For example, the distance between the electrode 1020 and the axis line 1046 is different from the distance between the electrode 1022 and the axis line 1046. Similarly, other electrodes may have a slightly different distance to axis lines in order to form the partial symmetry, as described above. As such, the variation between the peaks and valleys is reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Referring now to FIG. 10C, a configuration similar to that of FIGS. 10A and 10B is shown. In this embodiment, the areas as well as the distance between the electrodes and axis line(s) is different to form partial symmetry. As such, the variation between the peaks and valleys is reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Figure 11A:
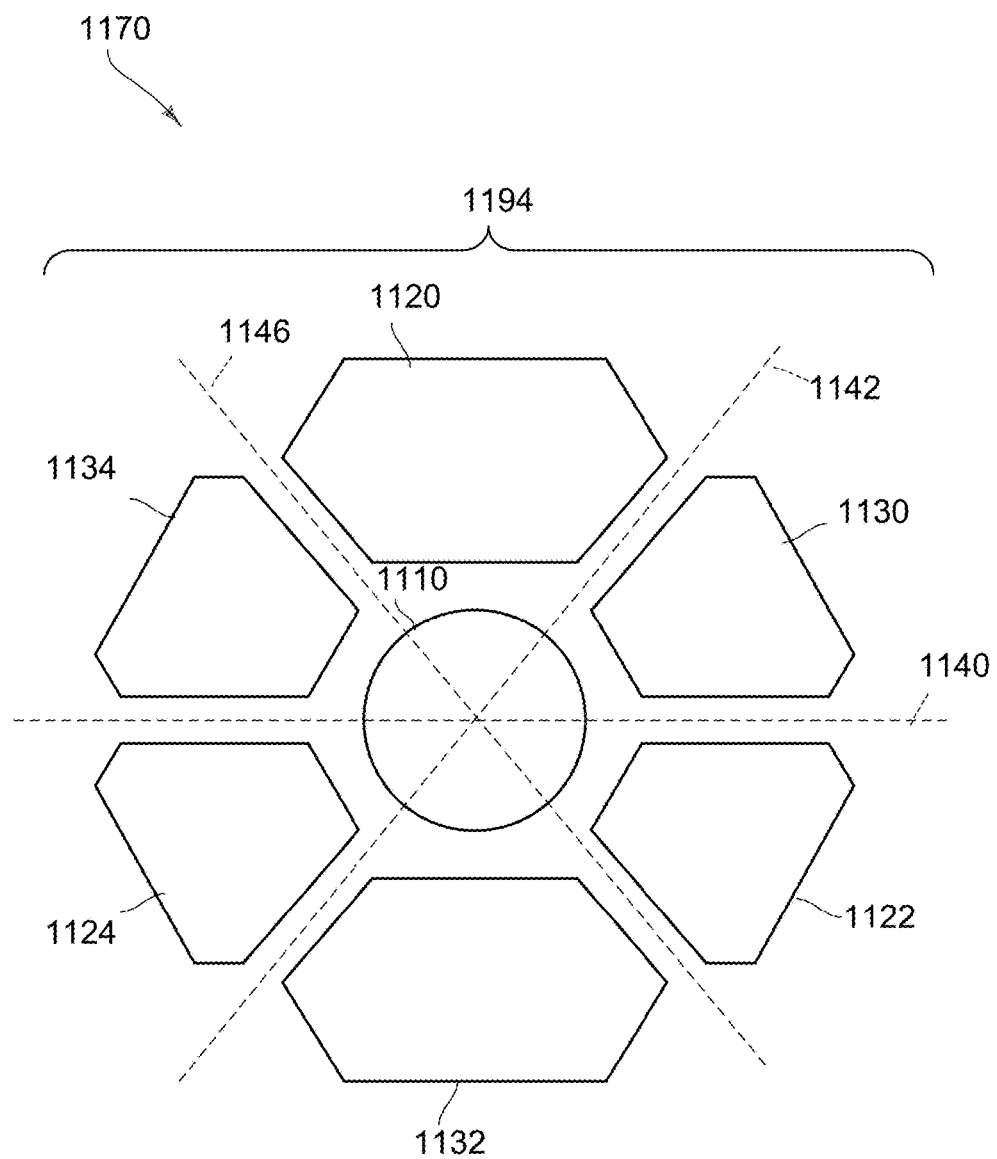
FIGS. 11A-11C show a top view of MEMS sensor with a pattern of partial symmetry for sensing elements in accordance with some embodiments.
Figure 11B:
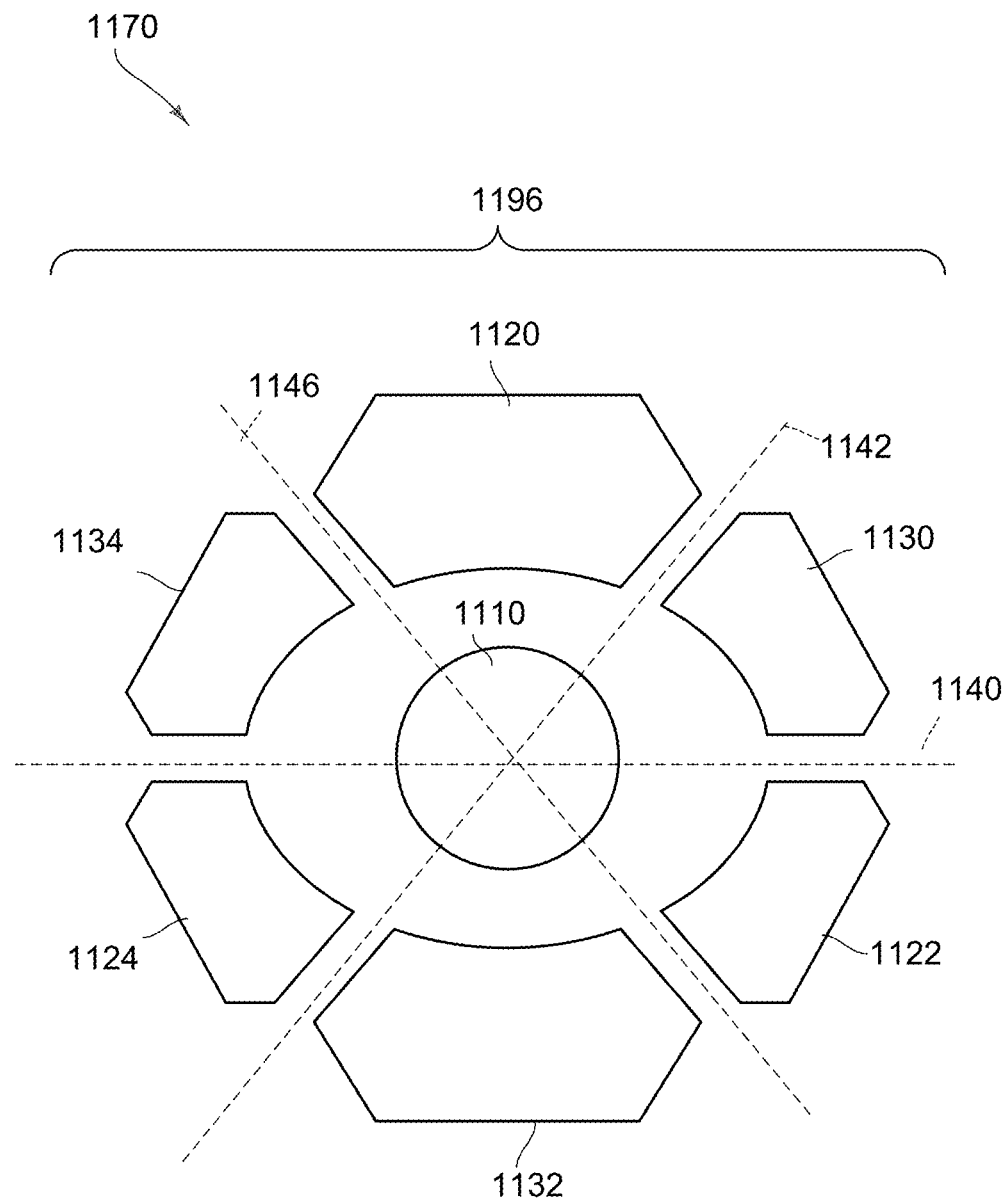
Figure 11C:
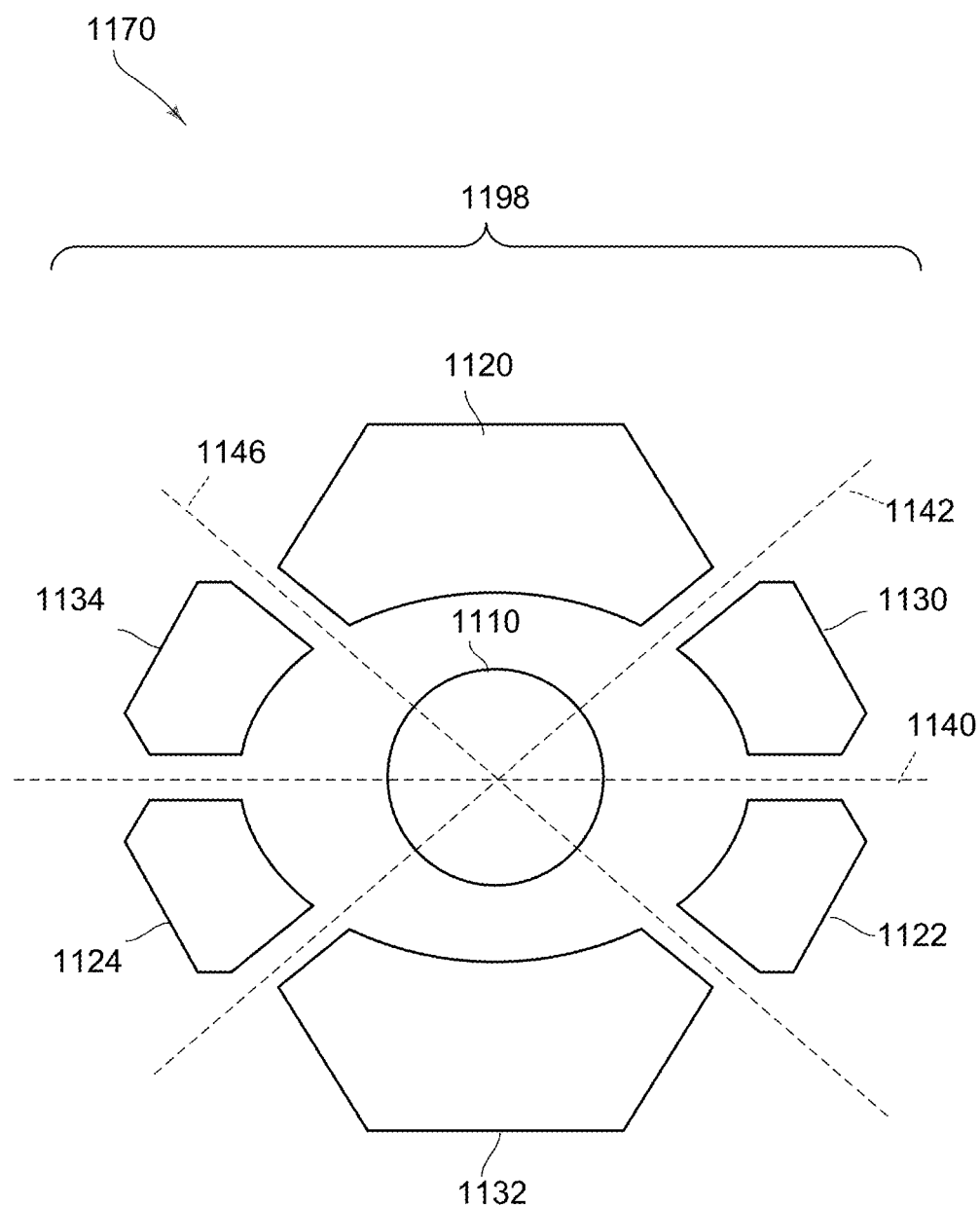

Referring now to FIGS. 11A-11C, a top view of MEMS sensor with a pattern of partial symmetry for sensing elements in accordance with some embodiments. FIG. 11A illustrates a diagram 1170 with a top view 1194 of a substrate portion of a MEMS sensor with a pattern of sensing elements in accordance with an embodiment. The top view 1194 shows a top view of AA which results in a top side of the pattern of sensing elements that comprise positive and negative electrodes. The top view 1194 includes the anchor 1110 of the MEMS sensor, positive electrodes 1120, 1122, and 1124, negative electrodes 1130, 1132, and 1134, and three axes of partial symmetry 1140, 1142, and 1146 denoted by the dashed lines. It is appreciated that the shape of the anchor 1110 is circular in this embodiment but it may have any shape and the circular shape of the anchor should not be construed as limiting the scope of the embodiments. In this embodiment, the circular shape of the anchor 1110 creates partial symmetry with the electrodes 1120-1134 due to their elliptical shape.

In one embodiment, the MEMS device comprises a spring connected between the anchor 1110 and a proof mass. The proof mass moves in the z axis to an external force that includes but is not limited to acceleration, magnetic, Coriolis, pressure, and many others. The pattern of sensing elements comprises alternating positive and negative electrodes 1120-1124 and 1130-1134 and are connected between the MEMS device and the sensing reference plane 260. The positive electrode sensing elements 1120-1124 detect positive movements and the negative electrode sensing elements 1130-1134 detect negative movements. In one embodiment, the shape of the electrode sensing elements 1120-1124 and 1130-1134 are annular/elliptical sectors.

It is appreciated that the electrodes 1120-1134 in this embodiment are within the same distance or radius from the anchor 1110. However, the areas associated with each electrode are different to create the partial symmetry as discussed above. It is appreciated that the area of each electrode is grossly exaggerated for illustrative purposes. However, it is appreciated that the configuration of the electrodes is such that they are highly symmetrical with slight asymmetry between them as illustrated by different areas associated with each electrode. It is further appreciated that equations (1)-(3) may similarly be used to illustrate the partial symmetry that exists between the electrodes. As such, the variation between the peaks and valleys are reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Referring now to FIG. 11B, a configuration similar to that of FIG. 11A is shown except that the areas for the electrodes 1120-1134 are the same, however, the distance between each electrode and an axis line is different to form the partial symmetry, as described above. For example, the distance between the electrode 1120 and the axis line 1146 is different from the distance between the electrode 1122 and the axis line 1146. Similarly, other electrodes may have a slightly different distance to axis lines in order to form the partial symmetry, as described above. As such, the variation between the peaks and valleys is reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Referring now to FIG. 11C, a configuration similar to that of FIGS. 11A and 11B is shown. In this embodiment, the areas as well as the distance between the electrodes and axis line(s) is different to form partial symmetry. As such, the variation between the peaks and valleys is reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Figure 12A:
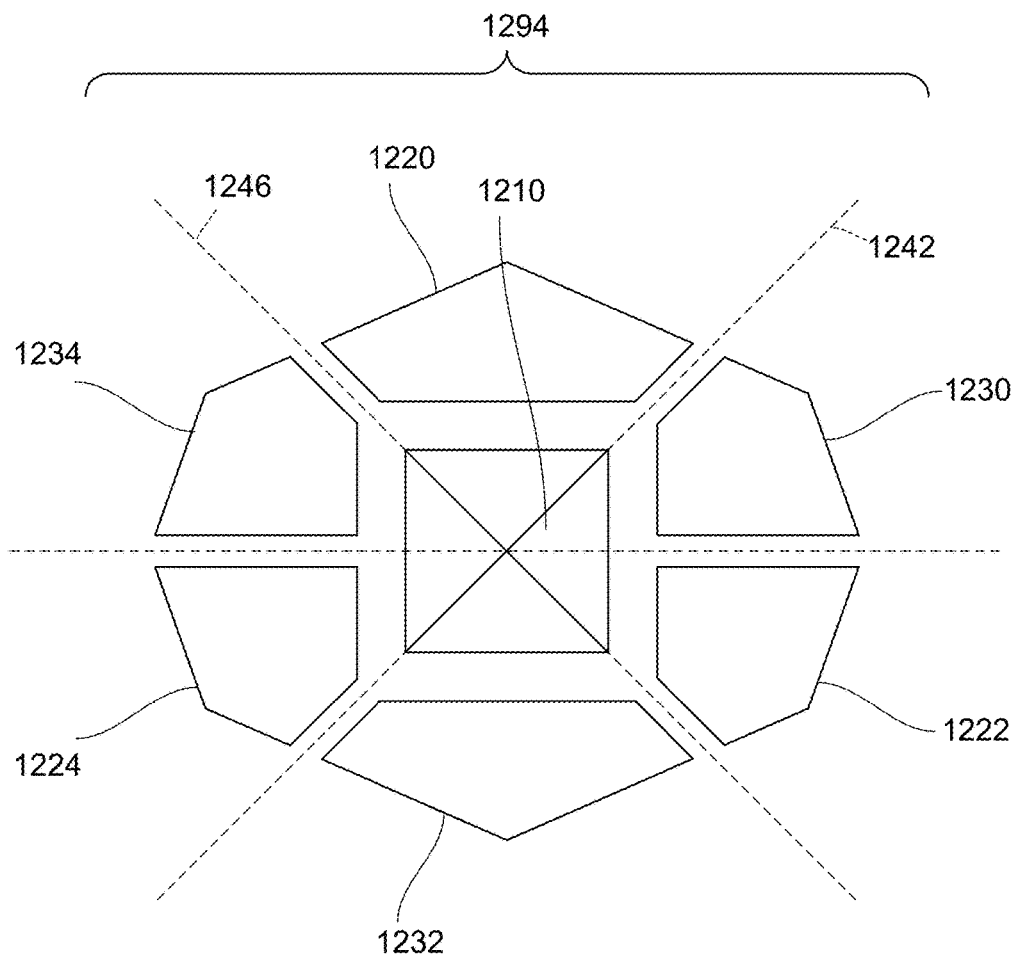
FIGS. 12A-12C show a top view of MEMS sensor with a different pattern of partial symmetry for sensing elements in accordance with some embodiments.
Figure 12B:
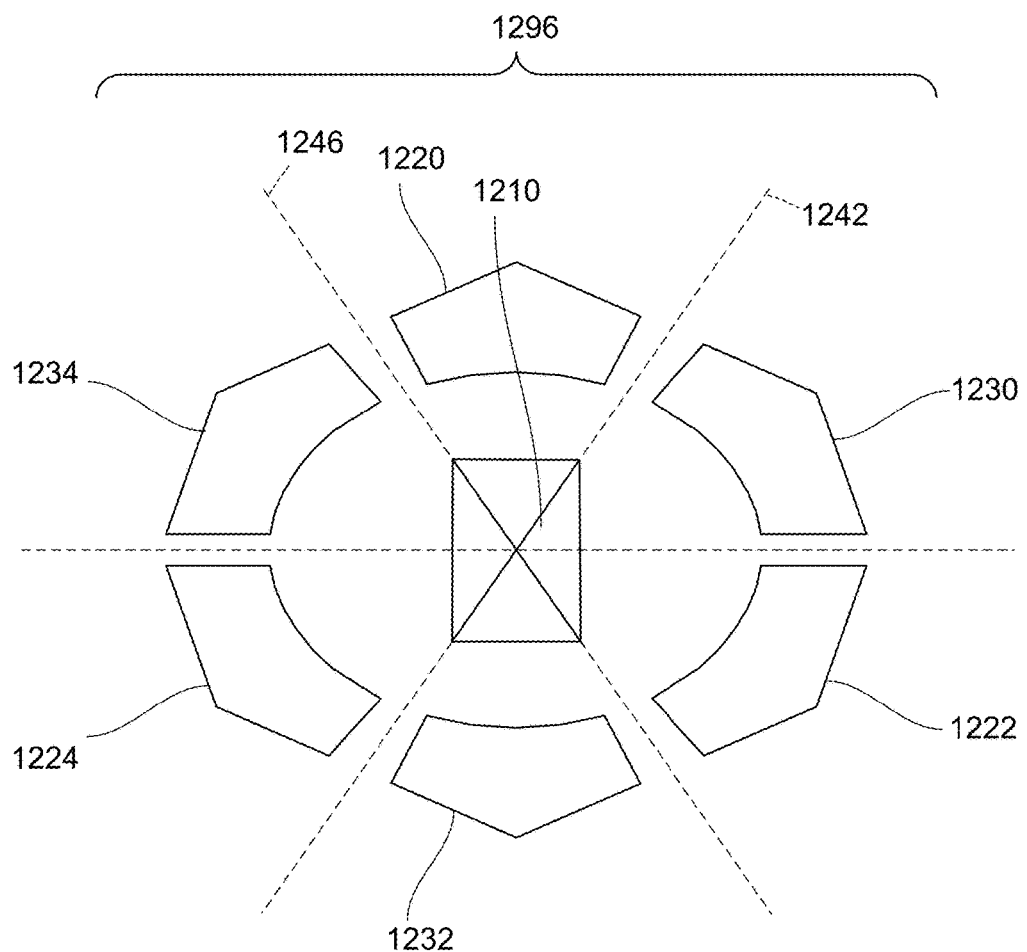
Figure 12C:
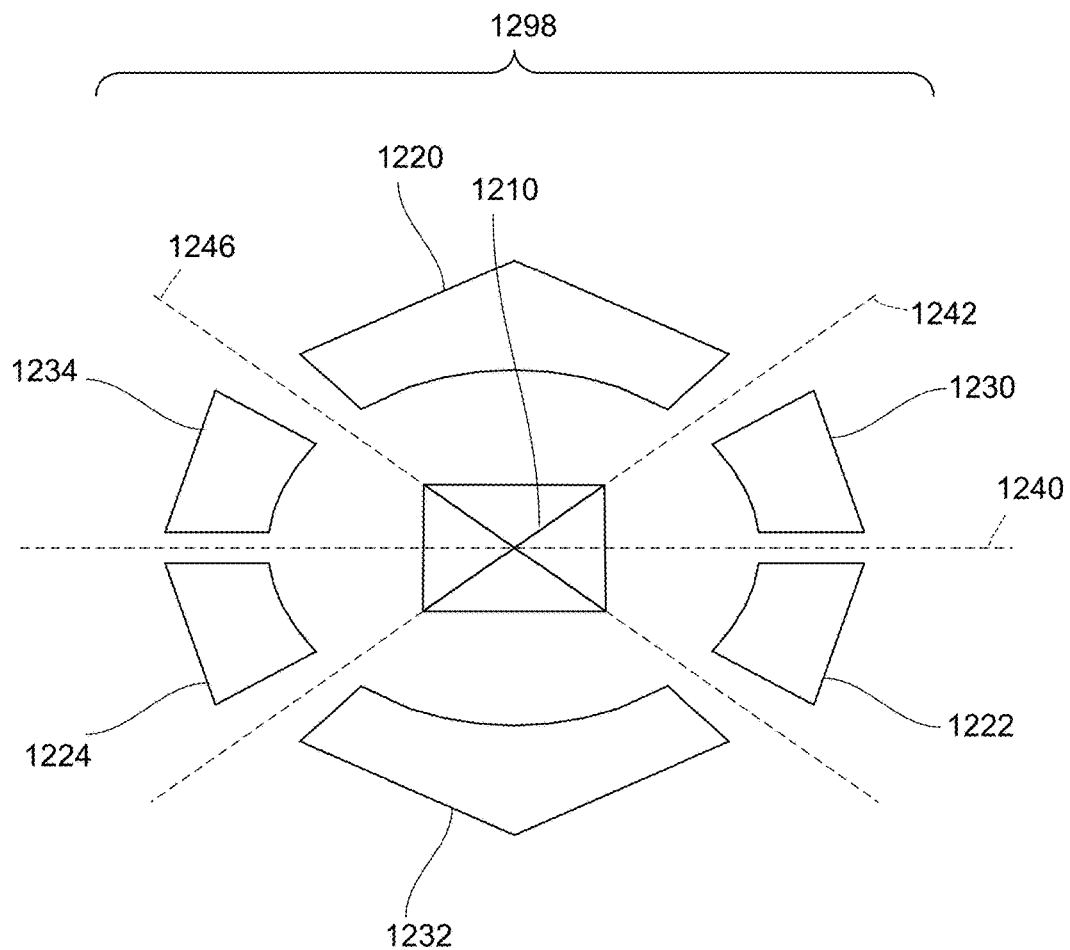

Referring now to FIGS. 12A-12C, a top view of MEMS sensor with a different pattern of partial symmetry for sensing elements in accordance with some embodiments is shown. FIG. 12A is similar to that of FIG. 10A, except that the electrodes 1220-1234 have a different shape. Electrodes 1220-1234 correspond to electrodes 1020-1034. The anchor 1210 has a different shape than anchor 1010. The pattern 1294 forms partial symmetry with respect to axis line 1242 and 1246 by varying the area, distance, and/or gap associated with the electrodes 1220-1234. Referring now to FIG. 12B, the areas associated with electrodes 1220-1234 is varied from that of FIG. 12A. Moreover, the distances of the electrodes 1220-1234 to the anchor 1210 is varied from that of FIG. 12A. Referring now to FIG. 12C, the areas associated with electrodes 1220-1234 is varied from that of FIGS. 12A and 12B. Moreover, the distances of the electrodes 1220-1234 to the anchor 1210 is varied from that of FIGS. 12A and 12B. As such, the variation between the peaks and valleys are reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Figure 13A:
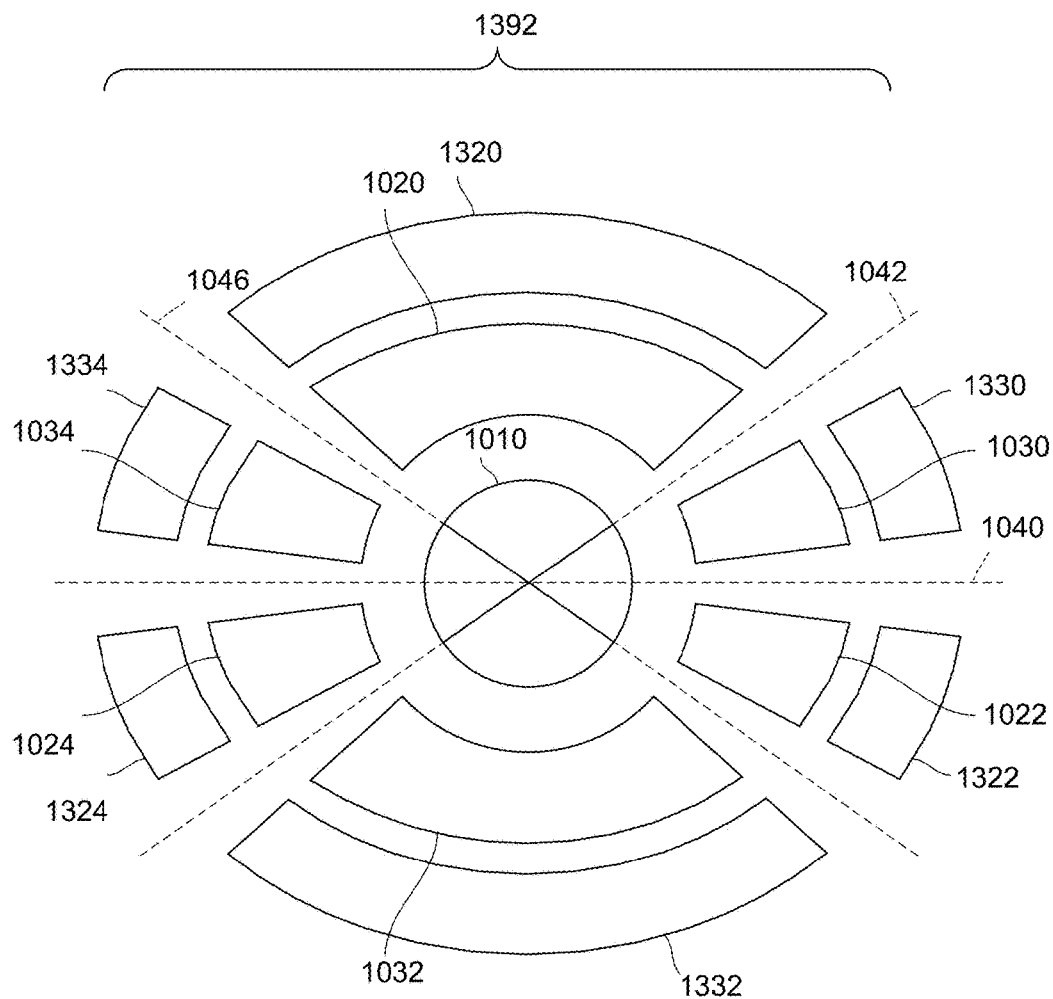
FIG. 13A-13C show a top view of MEMS sensor with a yet another pattern of sensing elements in accordance with some embodiments.
Figure 13B:
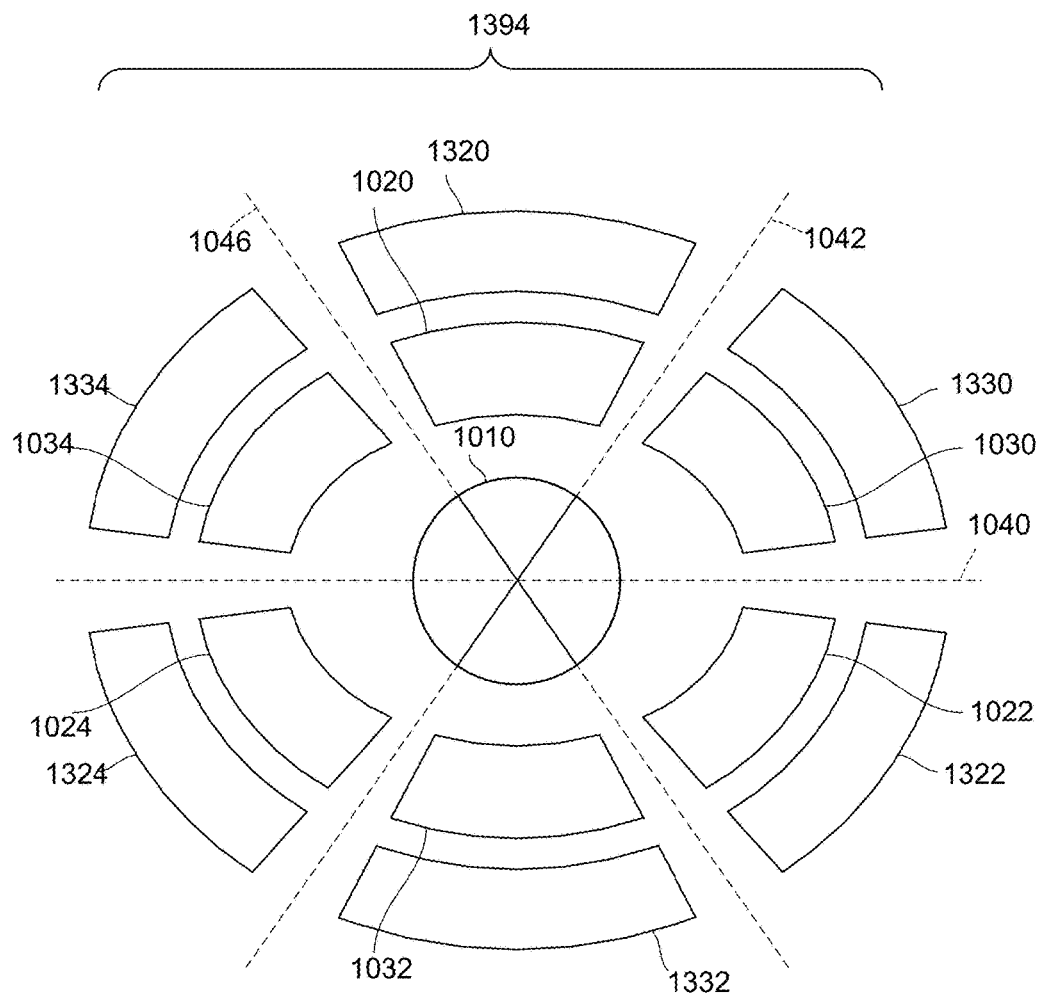
Figure 13C:
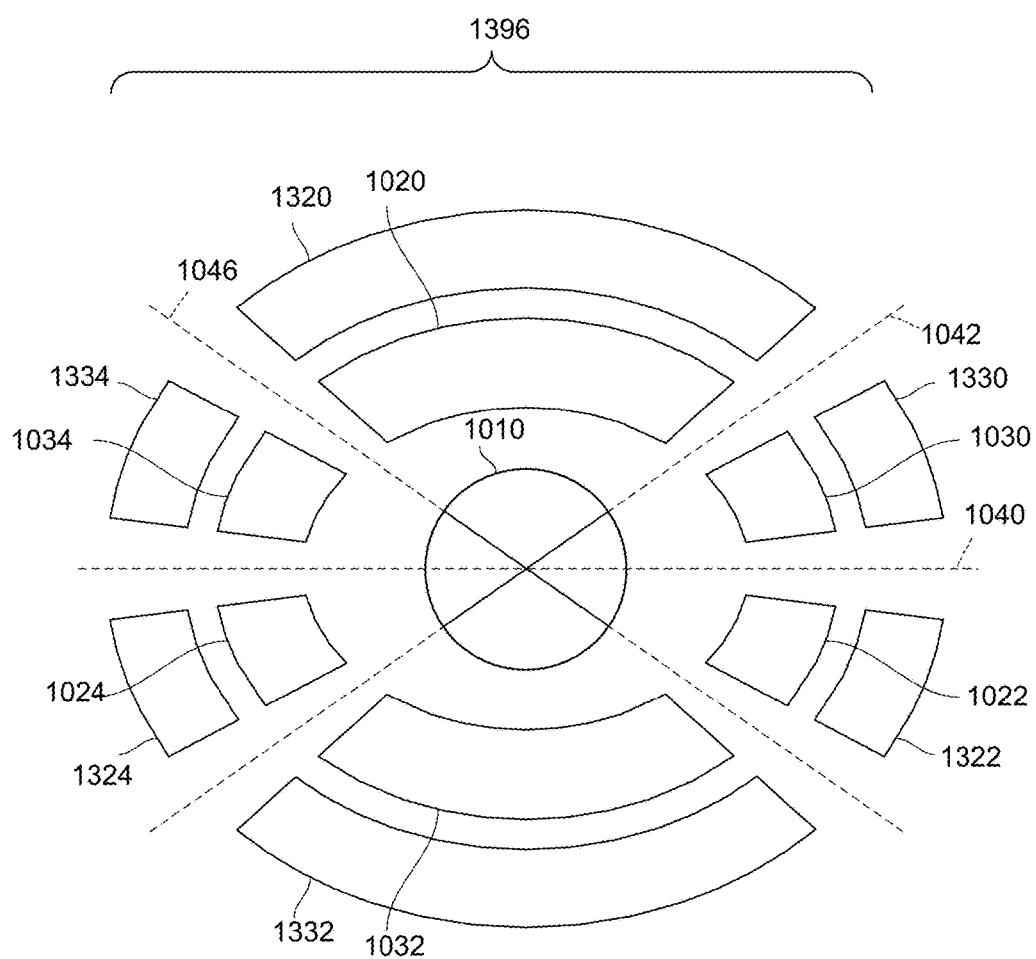

Referring now to FIG. 13A-13C, a top view of MEMS sensor with a yet another pattern of sensing elements in accordance with some embodiments is shown. Referring to FIG. 13A, sensing configuration 1392 is shown. Sensing configuration 1392 is similar to that of FIG. 10A, however, a second set of sensing elements 1320-1334 are formed on an outer periphery of sensing elements 1020-1034. It is appreciated that in some embodiments, the sensing element positioned on the periphery that is adjacent to the inner sensing element may have opposing polarities. For example, electrodes 1020 and 1320 may have opposite polarity. Similarly, electrodes 1022 and 1322 may have opposite polarity. Similar to the configuration of FIG. 10A, partial symmetry is formed. As such, the variation between the peaks and valleys are reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Referring now to FIG. 13B, sensing configuration 1394 is shown. Sensing configuration 1394 is similar to that of FIG. 10B, however, a second set of sensing elements 1320-1334 are formed on an outer periphery of sensing elements 1020-1034. It is appreciated that in some embodiments, the sensing element positioned on the periphery that is adjacent to the inner sensing element may have opposing polarities. For example, electrodes 1020 and 1320 may have opposite polarity. Similarly, electrodes 1022 and 1322 may have opposite polarity. Similar to the configuration of FIG. 10B, partial symmetry is formed. As such, the variation between the peaks and valleys are reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Referring now to FIG. 13C, sensing configuration 1396 is shown. Sensing configuration 1396 is similar to that of FIG. 10C, however, a second set of sensing elements 1320-1334 are formed on an outer periphery of sensing elements 1020-1034. It is appreciated that in some embodiments, the sensing element positioned on the periphery that is adjacent to the inner sensing element may have opposing polarities. For example, electrodes 1020 and 1320 may have opposite polarity. Similarly, electrodes 1022 and 1322 may have opposite polarity. Similar to the configuration of FIG. 10C, partial symmetry is formed. As such, the variation between the peaks and valleys are reduced using the partial symmetrical configuration for the sensing elements. As a result, although the offset at about the axis of symmetry is slightly higher than the offset in the symmetrical configuration, the partial symmetrical configuration outperforms the symmetrical configuration for virtually all other curvature angles of the sensing reference plane that ranges between 0° to 360° degrees, thereby resulting in a better overall performance.

Although the present embodiments have been described in accordance with the embodiments shown, one of ordinary skill in the art will readily recognize that there could be variations to the embodiments and those variations would be within the spirit and scope of the present embodiment. Accordingly, many modifications may be made by one of ordinary skill in the art without departing from the spirit and scope of the appended claims.

What is claimed is:

1. A Microelectromechanical System (MEMS) sensor comprising:
a first plurality of sensing elements positioned on a surface forming a sensing reference plane; an anchor coupled to the surface; a proof mass coupled to the anchor, wherein the proof mass moves under an external excitation; wherein the first plurality of sensing elements is configured to detect motion normal to the sensing reference plane, wherein the first plurality of sensing elements comprises positive and negative electrodes, and wherein an axis line formed between the first plurality of sensing elements is a straight line that goes through a center of the anchor, and wherein the axis line forms a first sensing elements section and a second sensing elements section from the first plurality of sensing elements, wherein a symmetrical correlation between the first sensing elements section and the second sensing elements section is nonzero, and wherein the symmetrical correlation is based on a polarity of sensing elements within each section, and wherein the symmetrical correlation is further based on an area of each sensing element within each section, and wherein the symmetrical correlation is further based on a distance of each sensing element within each section to the axis line; and a signal processing circuit configured to combine electrical charges generated by the first plurality of sensing elements to provide an output that is proportional to the external excitation.

2. The MEMS sensor of claim 1, wherein the symmetrical correlation associated with the first sensing elements section is within 5% of the second sensing elements section.

3. The MEMS sensor of claim 1, wherein a sensing element of the first plurality of sensing elements is a sensor selected from a group consisting of variable capacitor, a piezo-resistors, piezo-electric, magnetic, and optical sensor.

4. The MEMS sensor of claim 1, wherein an area of the first sensing elements section is different from an area of the second sensing elements section.

5. The MEMS sensor of claim 1, wherein at least two sensing elements of the first plurality of sensing elements are positioned at a different distance to the axis line.

6. The MEMS sensor of claim 1, wherein each sensing element is any of circular, rectangular, square, hexagonal, octagonal, annular sector, and polygonal in shape.

7. The MEMS sensor of claim 1, wherein the symmetrical correlation is a summation of a product of a polarity associated with each sensing element and its associated area and the distance to the anchor within each sensing elements section.

8. The MEMS sensor of claim 1 further comprising:
a second plurality of sensing elements formed on an outer periphery of the first plurality of sensing elements.

9. The MEMS sensor of claim 1, wherein the first sensing elements section is asymmetric with respect to the second sensing elements section.

10. The MEMS sensor of claim 1, wherein the symmetrical correlation is further based on a gap between the proof mass and the sensing reference plane.

11. A Microelectromechanical System (MEMS) sensor comprising:
a sensing element positioned on a surface forming a sensing reference plane; an anchor coupled to the surface; a proof mass coupled to the anchor, wherein the proof mass moves under an external excitation; wherein the sensing element comprises a first plurality of sensing elements coupled between the sensing reference plane and the proof mass to detect motion normal to the sensing reference plane and a second plurality of sensing elements coupled between the sensing reference plane and the proof mass to detect motion normal to the sensing reference plane,
wherein the first plurality of sensing elements has partial symmetry with the second plurality of sensing elements based on polarities of sensing elements, areas of sensing elements, and distance of sensing elements to the anchor generates an offset that is substantially constant for curvature angles of the sensing reference plane that ranges between 0° to 360° degrees, wherein the offset that is substantially constant is greater than zero and is less than a maximum offset for a MEMS sensor with curvature angles of the sensing reference planes that ranges between 0° to 360° degrees with sensing elements that form a perfect symmetry based on polarities of its corresponding sensing elements, areas of its corresponding sensing elements, and distance of its corresponding sensing elements to the anchor; and
a signal processing circuit configured to combine electrical charges generated by the first plurality of sensing elements and the second plurality of sensing elements to provide an output that is proportional to the external excitation.

12. The MEMS sensor of claim 11, wherein the partial symmetry between the first plurality of sensing elements and the second plurality of sensing elements is within 5% of one another.

13. The MEMS sensor of claim 11, wherein a sensing element of the first plurality of sensing elements is a sensor selected from a group consisting of variable capacitor, a piezo-resistors, piezo-electric, magnetic, and optical sensor, and wherein a sensing element of the second plurality of sensing elements is a sensor selected from a group consisting of variable capacitor, a piezo-resistors, piezo-electric, magnetic, and optical sensor.

14. The MEMS sensor of claim 11, wherein a sensing element of the first plurality of sensing elements is positioned at a different distance to the anchor than a sensing element of the second plurality of sensing elements.

15. The MEMS sensor of claim 11, wherein each sensing element is any of circular, rectangular, square, hexagonal, octagonal, annular sector, and polygonal in shape.

16. The MEMS sensor of claim 11, wherein the offset is a summation of a product of a polarity associated with each sensing element and its associated area and the distance to the anchor.

17. The MEMS sensor of claim 11, wherein the partial symmetry is further based on a gap between the proof mass and the sensing reference plane.

18. The MEMS sensor of claim 11, wherein an area of a sensing element of the first plurality of sensing elements is different from an area of a sensing element of the second plurality of sensing elements.

19. A Microelectromechanical System (MEMS) sensor comprising:
a first plurality of sensing elements positioned on a surface forming a sensing reference plane; an anchor coupled to the surface; a proof mass coupled to the anchor, wherein the proof mass moves under an external excitation; wherein the first plurality of sensing elements is configured to detect motion normal to the sensing reference plane;
a signal processing circuit configured to combine electrical charges generated by the plurality of sensing elements to provide an output in response to the external excitation,
wherein an axis line formed between the plurality of sensing elements is a straight line that goes through a center of the anchor, and wherein the axis line forms a first sensing elements section and a second sensing elements section from the plurality of sensing elements
wherein placement, size, and shape associated with each sensing element of the first sensing elements section and the second sensing elements section forms a partial symmetry,
wherein the partial symmetry between the first sensing elements section and the second sensing elements section is defined as a difference between a first function and a second function,
wherein the first function results in a zero summation and wherein the second function results in a non-zero summation, wherein the first function is based on a product of polarity, area, and a first polynomial of a distance of each sensing element of the first sensing elements section to the axis line, wherein the second function is based on a product of polarity, area, and a second polynomial of a distance of each sensing element of the second sensing elements section to the axis line.

20. The MEMS sensor of claim 19, wherein an area of the first sensing elements section is different from an area of the second sensing elements section.

21. The MEMS sensor of claim 19, wherein at least two sensing elements of the first plurality of sensing elements are positioned at a different distance to the axis line.

* * * * *